United States Patent
Tinoco et al.

(10) Patent No.: US 10,752,206 B2
(45) Date of Patent: Aug. 25, 2020

(54) VEHICLE SEAT BELT WITH WIRELESS LATCH SENSOR

(71) Applicant: CTS Corporation, Lisle, IL (US)

(72) Inventors: Gonzalo Lopez Tinoco, Novi, MI (US); Xiaofeng Huang, Chicago, IL (US); Adam Ariffin, Naperville, IL (US); John Jablonski, Chicago, IL (US); Jason D. Turner, Canton, MI (US)

(73) Assignee: CTS Corporation, Lisle, IL (US)

( * ) Notice: Subject to any disclaimer, the term of this patent is extended or adjusted under 35 U.S.C. 154(b) by 0 days.

(21) Appl. No.: 16/275,995

(22) Filed: Feb. 14, 2019

(65) Prior Publication Data

US 2019/0256041 A1 Aug. 22, 2019

Related U.S. Application Data

(60) Provisional application No. 62/781,109, filed on Dec. 18, 2018, provisional application No. 62/688,533, filed on Jun. 22, 2018, provisional application No. 62/631,722, filed on Feb. 17, 2018.

(51) Int. Cl.
  *G08B 21/02* (2006.01)
  *B60R 22/48* (2006.01)
  *G01R 33/07* (2006.01)

(52) U.S. Cl.
  CPC ............ *B60R 22/48* (2013.01); *G01R 33/072* (2013.01); *B60R 2022/4816* (2013.01)

(58) Field of Classification Search
  None
  See application file for complete search history.

(56) References Cited

U.S. PATENT DOCUMENTS

| 3,806,867 A | 4/1974 | Quantz |
| 6,025,783 A | 2/2000 | Steffens, Jr. et al. |
| 6,142,524 A | 11/2000 | Brown et al. |
| 6,362,734 B1 | 3/2002 | McQuade et al. |

(Continued)

FOREIGN PATENT DOCUMENTS

| DE | 102005034251 A1 | 2/2007 |
| DE | 102012020031 A1 | 4/2014 |

(Continued)

OTHER PUBLICATIONS

Evenflo Company, Inc., SensorSafen™ Wireless Child Seat Buckle, 2017 (www.evenflo.com/sensorsafe) US.

*Primary Examiner* — Brent Swarthout
(74) *Attorney, Agent, or Firm* — Daniel Deneufbourg

(57) ABSTRACT

A buckle, such as a vehicle seat belt buckle, operable between a buckled and unbuckled condition. A sensor integrated circuit in the buckle senses the buckled or unbuckled condition of the buckle and generates an electrical signal indicative of the buckled or unbuckled condition of the buckle. A RF integrated circuit in the buckle and in the form of a microcontroller integrated circuit with an RF signal transmitter receives the electrical signal generated by the sensor integrated circuit and transmits an RF signal indicative of the buckled or unbuckled condition of the buckle to a vehicle's control unit via an RF signal antenna in the buckle. A battery in the buckle provides power to the sensor and RF integrated circuits.

10 Claims, 12 Drawing Sheets

(56) References Cited

U.S. PATENT DOCUMENTS

| | | |
|---|---|---|
| 6,750,764 B1 | 6/2004 | Henninger |
| 6,809,640 B1 * | 10/2004 | Sherman ................ B60R 22/48 340/457.1 |
| 6,922,154 B2 | 7/2005 | Kraljic et al. |
| 7,002,457 B2 | 2/2006 | Stevenson et al. |
| 7,132,934 B2 | 11/2006 | Allison, III |
| 7,271,712 B2 | 9/2007 | Rubel |
| 7,321,306 B2 | 1/2008 | Lee et al. |
| 7,340,809 B2 | 3/2008 | Tracy et al. |
| 7,383,911 B2 | 6/2008 | Schondorf et al. |
| 7,415,126 B2 | 8/2008 | Breed et al. |
| 7,642,907 B2 | 1/2010 | Tang et al. |
| 7,686,119 B2 | 3/2010 | Greene |
| 7,710,288 B2 | 5/2010 | Seguchi et al. |
| 7,762,583 B2 | 7/2010 | Federspiel |
| 7,786,864 B1 | 8/2010 | Shostak et al. |
| 7,812,716 B1 | 10/2010 | Cotter |
| 7,813,856 B2 | 10/2010 | McCall et al. |
| 7,830,246 B2 | 11/2010 | Hawkins |
| 7,916,008 B2 | 3/2011 | Nathan et al. |
| 8,090,504 B2 | 1/2012 | Long et al. |
| 8,217,770 B2 | 7/2012 | Messner et al. |
| 8,282,163 B2 | 10/2012 | Cech et al. |
| 8,289,145 B2 | 10/2012 | Miller et al. |
| 8,427,294 B2 | 4/2013 | Cheung |
| 8,902,057 B2 | 12/2014 | Strutz et al. |
| 8,988,211 B2 | 3/2015 | Masudaya et al. |
| 9,415,748 B2 | 8/2016 | Sugawara et al. |
| 9,424,728 B2 | 8/2016 | Rambadt et al. |
| 9,457,716 B2 | 10/2016 | Westmoreland |
| 9,896,060 B2 | 2/2018 | Koike et al. |
| 10,035,492 B2 | 7/2018 | Lee |
| 10,131,318 B2 | 11/2018 | Davis |
| 10,137,852 B2 | 11/2018 | Foltin |
| 10,245,974 B2 | 4/2019 | Nishizaki et al. |
| 10,315,619 B2 | 6/2019 | Farooq et al. |
| 10,315,620 B1 | 6/2019 | Morgantini et al. |
| 2003/0160689 A1 | 8/2003 | Yazdgerdi |
| 2006/0095184 A1 | 5/2006 | Gray et al. |
| 2007/0096891 A1 | 5/2007 | Sheriff |
| 2007/0182535 A1 | 8/2007 | Seguchi |
| 2008/0238647 A1 | 10/2008 | Abe |
| 2009/0146789 A1 | 6/2009 | Holbein et al. |
| 2009/0201141 A1 | 8/2009 | Teshome et al. |
| 2009/0243892 A1 * | 10/2009 | Cheung ............... A44B 11/2569 340/945 |
| 2009/0299577 A1 | 12/2009 | Demant |
| 2010/0013622 A1 | 1/2010 | Rumps et al. |
| 2010/0283593 A1 | 11/2010 | Miller et al. |
| 2011/0282543 A1 | 11/2011 | Desmarais |
| 2013/0049947 A1 | 2/2013 | Lanter |
| 2013/0300555 A1 | 11/2013 | Sickon et al. |
| 2014/0052342 A1 | 2/2014 | Seibert |
| 2016/0015132 A1 * | 1/2016 | Curtin .................. H01R 13/665 439/37 |
| 2016/0288732 A1 * | 10/2016 | Schmotzer ......... A44B 11/2565 |
| 2017/0021800 A1 | 1/2017 | Seibert |
| 2017/0053510 A1 | 2/2017 | Lefebvre |
| 2017/0088041 A1 | 3/2017 | Johnson |
| 2017/0120813 A1 * | 5/2017 | Wilson .................... B60Q 9/00 |
| 2017/0186308 A1 | 6/2017 | Aplin et al. |
| 2017/0305340 A1 | 10/2017 | Rose et al. |
| 2018/0043861 A1 | 2/2018 | Kosugi |
| 2018/0170306 A1 | 6/2018 | Seaman, IV |
| 2018/0208318 A1 | 7/2018 | Brunaux et al. |
| 2018/0334134 A1 | 11/2018 | Desoyza |
| 2018/0354443 A1 | 12/2018 | Ebrahimi et al. |
| 2018/0361988 A1 | 12/2018 | Kato et al. |
| 2019/0103651 A1 | 4/2019 | Yanagida et al. |
| 2019/0135228 A1 | 5/2019 | Haymond |

FOREIGN PATENT DOCUMENTS

| | | |
|---|---|---|
| DE | 102016013453 A1 | 5/2017 |
| DE | 102017123640 A1 | 4/2019 |
| EP | 2189372 B1 | 6/2012 |
| EP | 2937251 B1 | 7/2017 |

* cited by examiner

VEHICLE SEAT BELT WITH WIRELESS LATCH SENSOR

CROSS-REFERENCE TO RELATED APPLICATIONS

This patent application claims priority and benefit of the filing date of U.S. Provisional Patent Application Ser. No. 62/631,722 filed on Feb. 17, 2018, U.S. Provisional Patent Application Ser. No. 62/688,533 filed on Jun. 22, 2018, and U.S. Provisional Patent Application Ser. No. 62/781,109 filed on Dec. 18, 2018, the disclosure and contents of which are expressly incorporated herein in their entireties by reference.

FIELD OF THE INVENTION

This invention relates generally to a buckle and, more specifically, to a vehicle seat belt buckle with a wireless buckle latch sensor.

BACKGROUND OF THE INVENTION

Currently available vehicle seat belt buckles include wired sensor assemblies associated therewith for monitoring and detecting the latching and unlatching of the seat belt buckle.

The present invention is directed to a vehicle seat belt buckle that can monitor and detect the latching and unlatching of the buckle using a wireless sensor.

SUMMARY OF THE INVENTION

The present invention is generally directed to a buckle comprising a sensor integrated circuit in the buckle for sensing a buckled or unbuckled condition of the buckle and generating an electrical signal indicative of the buckled or unbuckled condition of the buckle, a RF integrated circuit in the buckle for receiving the electrical signal generated by the sensor integrated circuit and generating an RF signal indicative of the buckled or unbuckled condition of the buckle, and a battery in the housing for providing power to the sensor and RF integrated circuits.

In one embodiment, the sensor integrated circuit is a Hall Effect sensor and further comprising a magnet in the buckle, the Hall Effect sensor sensing changes in the magnetic field of the magnet in response to a change in the buckled or unbuckled condition of the buckle.

In one embodiment, the buckle further comprises an RF signal antenna in the buckle, the RF integrated circuit being an integrated circuit incorporating a microcontroller and an RF signal transmitter for transmitting the RF signal to the RF signal antenna.

In one embodiment, the buckle further comprises a bracket and a substrate in the buckle, the integrated circuit and the RF signal antenna being located on the substrate, the Hall Effect sensor and the magnet being located on the bracket.

In one embodiment, the microcontroller is operable between low power and high power conditions and further comprising a movement activated device for switching the microcontroller between the low power and high power conditions.

In one embodiment, the device for switching the microcontroller between the low power and high power conditions comprises a tilt switch mounted on the printed circuit board of the module and operably coupled to the microcontroller.

In one embodiment, the buckle further comprises a bracket in the buckle for the sensor integrated circuit and the magnet.

In one embodiment, the RF integrated circuit is located on the bracket.

In one embodiment, the buckle further comprises a substrate on the bracket, the sensor and RF integrated circuits being mounted to the substrate. In one embodiment, the buckle further comprises a frame in the buckle and a bracket for mounting the battery to the frame.

In one embodiment, the buckle further comprises a flex circuit in the buckle, the sensor and RF integrated circuits and the battery being located on the flex circuit.

In one embodiment, the buckle comprises a vehicle seat belt buckle including an interior frame and a shunt plate in the buckle extendable into the first bracket into a relationship located between the sensor integrated circuit and the magnet for blocking the magnetic field generated by the magnet.

The present invention is also directed to a buckle comprising a sensor integrated circuit in the buckle for sensing a buckled or unbuckled condition of the buckle and generating an electrical signal indicative of the buckled or unbuckled state of the buckle, a RF integrated circuit in the buckle for receiving the electrical signal generated by the sensor integrated circuit and generating an RF signal indicative of the buckled or unbuckled condition of the buckle, an RF signal antenna in the buckle for transmitting the RF signal generated by the RF integrated circuit, a first bracket in the buckle for the sensor and RF integrated circuits and the RF signal antenna, and a battery in the buckle for providing power to the sensor and RF integrated circuits.

In one embodiment, the sensor integrated circuit is a Hall Effect sensor and further comprising a magnet on the first bracket in the buckle, the Hall Effect sensor sensing changes in the magnetic field of the magnet in response to a change in the buckled or unbuckled condition of the buckle, the RF integrated circuit being an integrated circuit incorporating a microcontroller and an RF signal transmitter.

In one embodiment, the buckle comprises a vehicle seat belt buckle including an interior frame and a shunt plate in the buckle extendable into the first bracket into a relationship located between the sensor integrated circuit and the magnet for blocking the magnetic field generated by the magnet, the first bracket and the battery being coupled to the interior frame of the vehicle seat belt buckle.

In one embodiment, the buckle further comprises an electrical power connection line in the buckle extending between the battery on the second bracket and the first and RF integrated circuits on the first bracket.

The present invention is further directed to a wireless sensor assembly for use in a buckle, the wireless sensor assembly comprising a sensor integrated circuit in the buckle for sensing the buckled or unbuckled condition of the buckle and generating an electrical signal indicative of the buckled or unbuckled condition of the buckle, a RF integrated circuit in the buckle for receiving the electrical signal generated by the sensor integrated circuit and generating an RF signal indicative of the buckled or unbuckled condition of the buckle, an RF signal antenna in the buckle for transmitting the RF signal generated by the RF integrated circuit, a first bracket in the buckle for the sensor and RF integrated circuits and the RF signal antenna, and a battery in the buckle for providing power to the sensor and RF integrated circuits.

In one embodiment, the sensor integrated circuit is a Hall Effect sensor and further comprising a magnet on the first bracket, the Hall Effect sensor sensing changes in the magnetic field of the magnet in response to a change in the buckled or unbuckled condition of the buckle, the RF integrated circuit being an integrated circuit incorporating a microcontroller and an RF signal transmitter.

In one embodiment, the buckle comprises a vehicle seat belt buckle including an interior frame and a shunt plate in the buckle extendable into the first bracket into a relationship located between the sensor integrated circuit and the magnet for blocking the magnetic field generated by the magnet, the first bracket and the battery being coupled to the interior frame of the vehicle seat belt buckle.

Other advantages and features of the buckle with the wireless sensor of the present invention will be more readily apparent from the following detailed description of the embodiments of the invention, the accompanying drawings, and the appended claims.

BRIEF DESCRIPTION OF THE DRAWINGS

These and other features of the invention can best be understood by the description of the accompanying FIGS. as follows.

DESCRIPTION OF THE EMBODIMENTS

Figure 1:
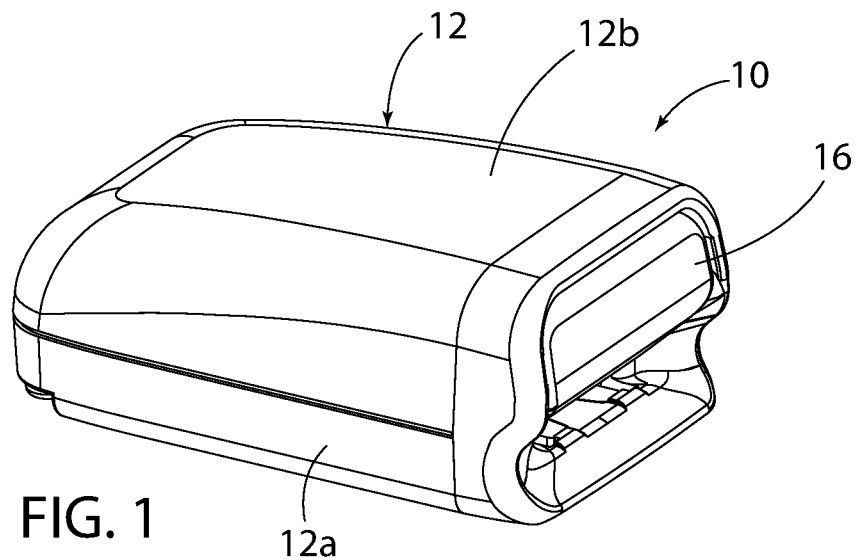
FIG. 1 is a perspective view of a buckle, and more specifically, a vehicle seat belt buckle, incorporating a first embodiment of a wireless latch sensor module in accordance with the present invention.

FIGS. 1-6 depict a buckle 10, and more specifically a vehicle seat belt buckle 10, incorporating a first embodiment of a wireless sensor module or assembly 100 in accordance with the present invention for wirelessly sensing and detecting the buckled or unbuckled condition of the buckle 10.

The seat belt buckle 10 comprises a housing 12 including a bottom housing base 12a and a top housing cover 12b coupled together via fasteners 13 and defining an interior cavity 14 for the interior components thereof including the following: a push button buckle tongue release member 16; a stationary seat belt buckle frame 17 including a central frame member 17a and sensor housing or bracket or carriage members 17b and 17c made of molded plastic or the like material and coupled to a corner of one of the vertical side walls of the central frame member 17a; a Hall Effect or the like sensor integrated circuit (IC) 18 mounted on a printed circuit board 19 and located in a first interior slot 15 of the bracket or housing member 17b; a magnet 20 located in a second interior slot 21 of the bracket or housing member 17b in a vertical relationship below and spaced from the Hall Effect sensor 18 and the printed circuit board 19; a movable and slidable Hall Effect sensor activation or shunt plate 22 which is coupled to the lever 16; and the wireless latch sensor assembly or module 100 as described in more detail below.

Thus, in the embodiment shown, both the release member 16 and the sensor brackets 17b and 17c are coupled to or mounted or supported by and to the frame member 17a.

Figure 4:
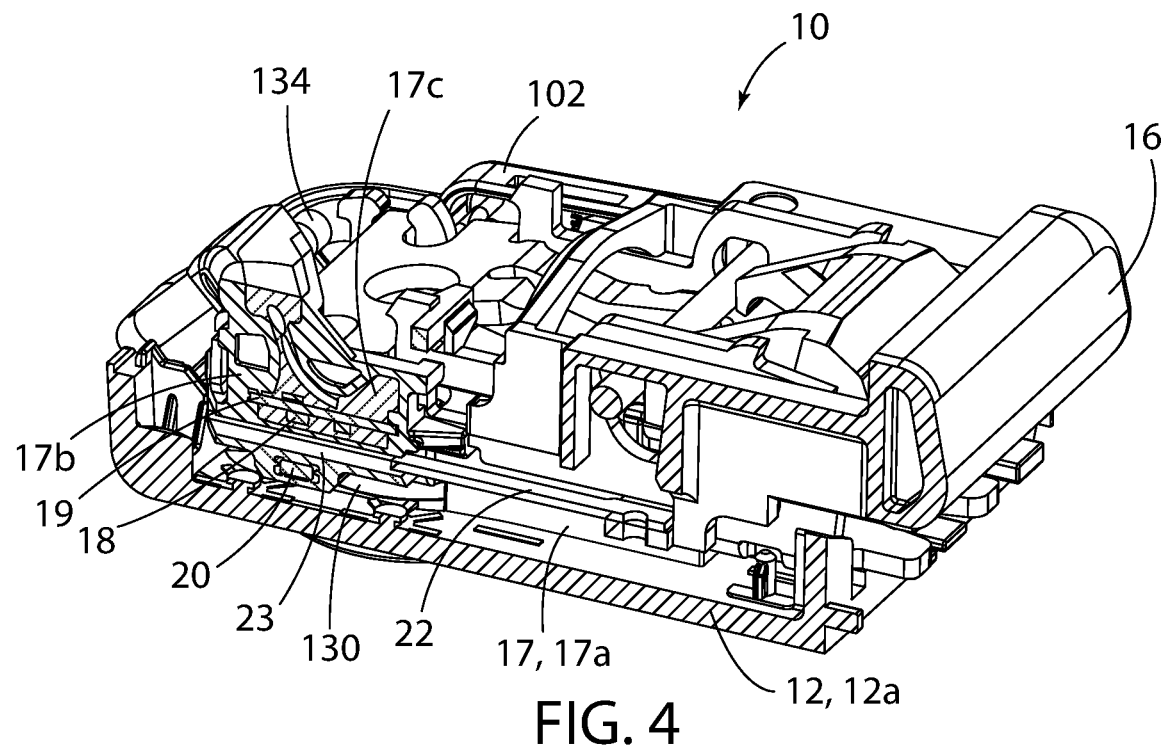
FIG. 4 is a part perspective, part vertical cross-sectional view of the buckle shown in FIG. 1 in its unlatched/unbuckled position.
Figure 5:
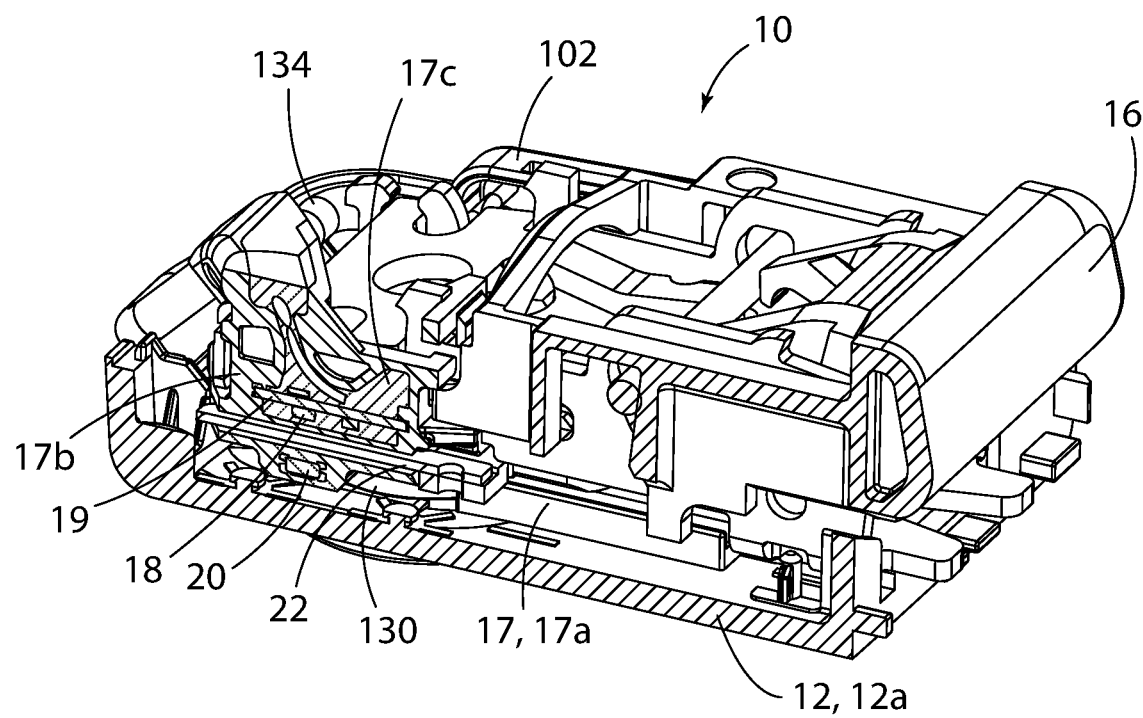
FIG. 5 is a part perspective, part vertical cross-sectional view of the buckle shown in FIG. 1 in its latched/buckled position.
Figure 6:
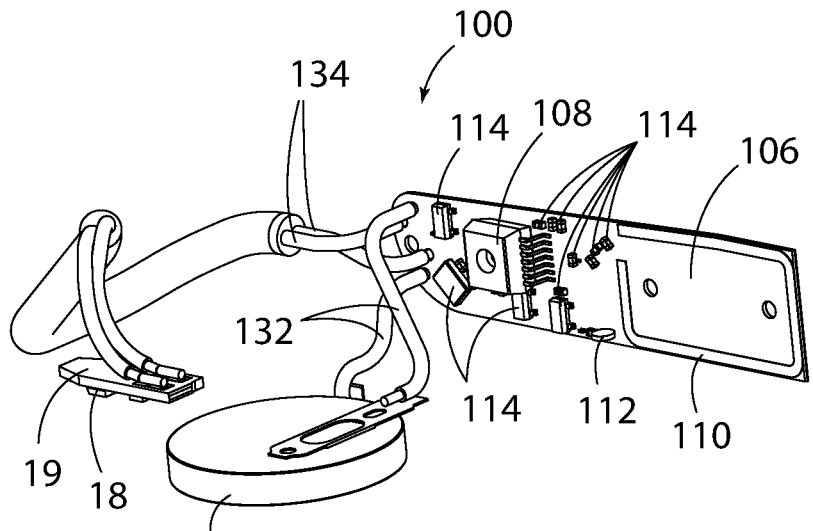
FIG. 6 is a perspective view of the wireless sensor module of the buckle shown in FIG. 1.

The insertion of a buckle tongue (not shown) into the buckle 10 results in the movement of a shunt plate 22 located in the interior of the buckle 10 from the buckle unlatched/unbuckled position of FIG. 4 to the buckle latched/buckled position of FIG. 5 in which the shunt plate 22 is extended into a third slot 23 defined in the bracket or housing member 17b and into a horizontal position located between the Hall Effect sensor 18 and the magnet 20 which are positioned in the bracket member 17b in a vertical spaced apart relationship relative to each other and, more specifically, into a position in which the plate 22 shields the magnet's magnetic field from the Hall Effect sensor 18.

Thus, the insertion or removal of a buckle tongue (not shown) into or from the buckle 10 results in the forward or rearward movement of the shunt plate 22 which results in a change in the magnitude and/or direction of the magnetic field sensed by the Hall Effect sensor 18 which results in the generation of a vehicle latch or unlatch electrical signal.

Although the FIGS. depict a Hall Effect integrated circuit (IC) sensor or sensor integrated circuit 18, it is understood that the vehicle buckle 10 can incorporate other suitable sensor integrate circuits adapted to sense the latch or unlatch conditions and positions of the buckle 10 including, for example, a magneto resistive integrated circuit sensor.

The wireless latch sensor module or assembly 100 in accordance with the present invention is located and housed in the interior cavity 14 of the buckle 10 and is adapted to provide a wireless RF signal transmission of the vehicle latch or unlatch signal generated by the Hall Effect sensor 18 to a vehicle's control module (not shown).

Figure 3:
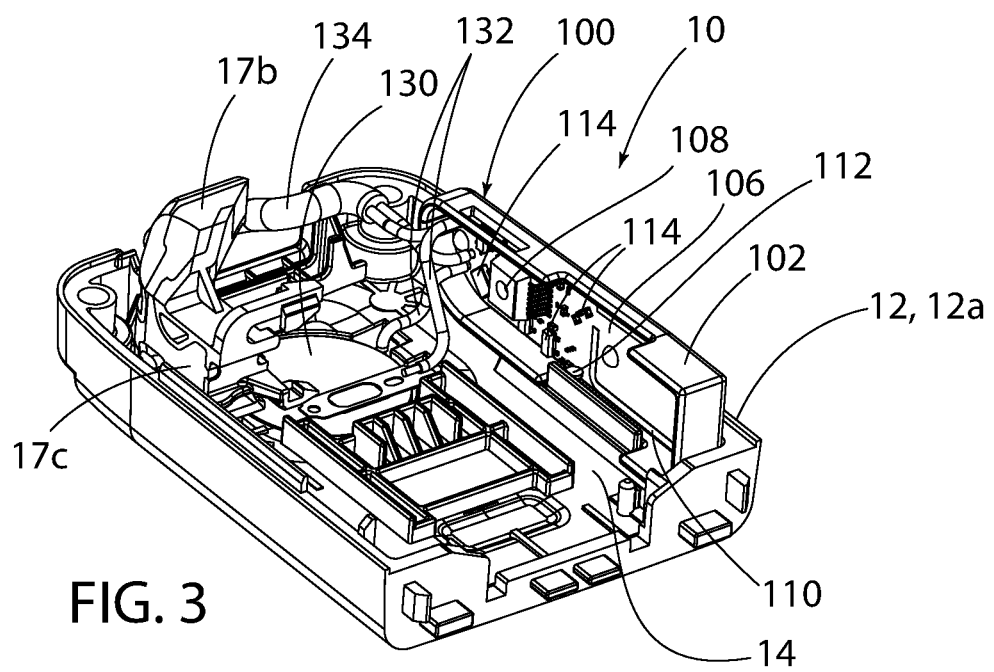
FIG. 3 is a perspective view of the buckle shown in FIG. 1 without the top housing cover.
Figure 2:
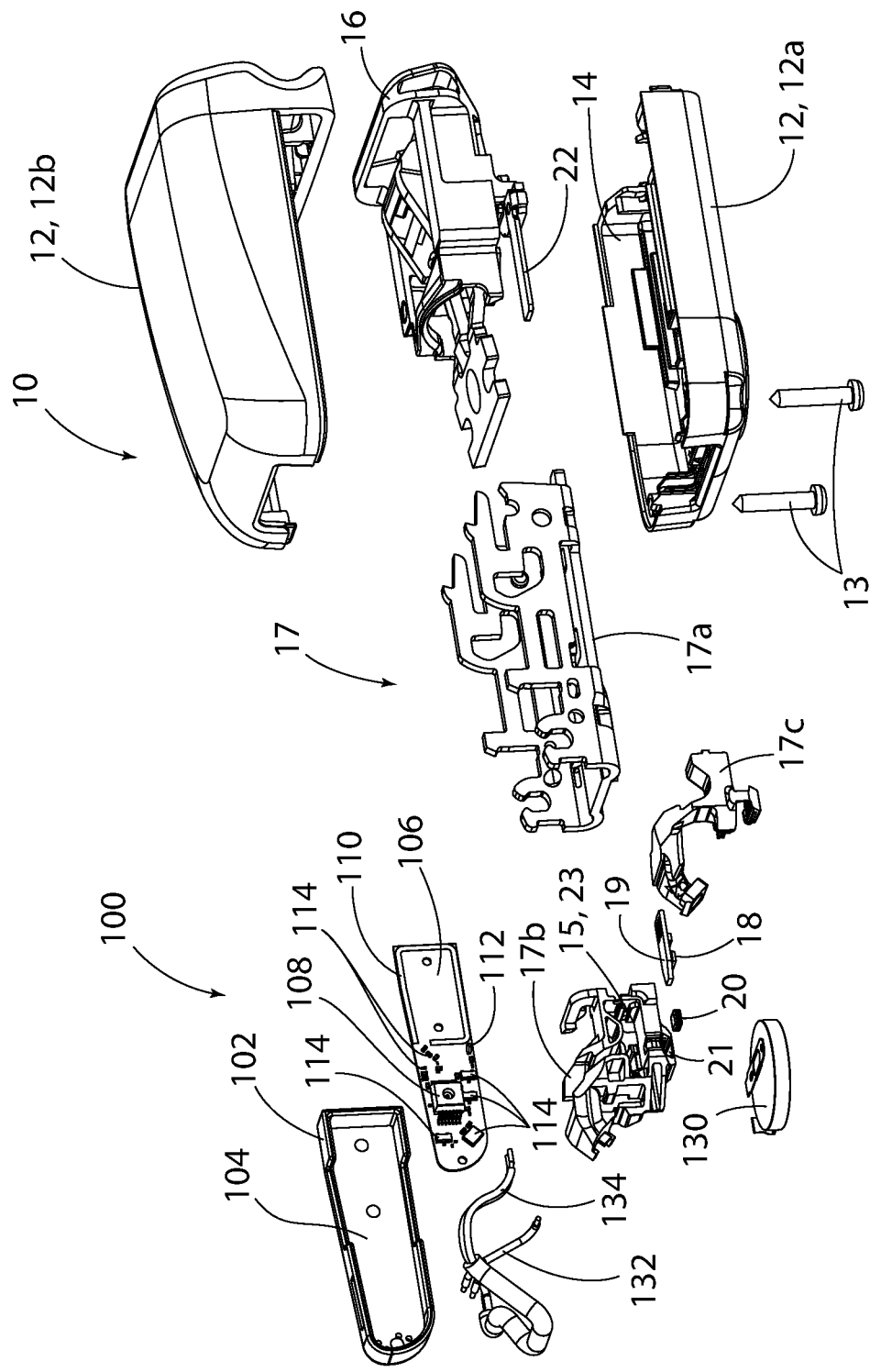
FIG. 2 is an exploded perspective view of the buckle shown in FIG. 1.

As shown in FIGS. 2 and 3, the wireless sensor module 100 comprises in part a rectangular elongate sensor housing 102 made of plastic or like material and defining an interior cavity 104 for a rectangular and elongate printed circuit board or substrate 106 that includes at least the following components mounted or formed thereon: a combination microcontroller/RF signal transmitter integrated circuit (IC) sensor 108; an RF signal transmission antenna 110 formed on the surface of the substrate 106; a tilt switch 112; and a plurality of electrical components including, for example, a plurality of resistors and capacitors 114.

The microcontroller/RF signal transmission IC 108 is adapted for at least the following functions: timing and power management; data acquisition from on-board sensors; logic control; RF signal control; on-board diagnostics; and transmission of RF signals via the RF antenna 110 to an RF signal receiver (not shown) in a vehicle's controller (not shown).

The tilt switch 112, or other suitable wake-up device including for example LF, is adapted to generate an electrical signal in response to motion or movement or vibration of the buckle 10 that causes the microcontroller/RF signal transmission IC 108 to switch from an idle low power state into a wake-up high power state as described in more detail below.

The wireless latch sensor module or assembly 100 also comprises a battery or coil cell 130 separate from the sensor housing 102 and also located in the interior cavity 104 of the buckle 10 for powering the microcontroller/RF signal transmission IC 108 and associated electronics on the printed circuit board or substrate 106.

The wireless latch sensor module or assembly 100 further comprises power transmission wires or terminals 132 extending in the interior cavity 104 of the buckle 10 between the battery 130 and the printed circuit board or substrate 106 and electrical signal transmission wires or terminals 134 extending in the interior cavity 104 of the buckle 10 between the Hall Effect sensor 18 on the circuit board or substrate 19 and the microcontroller/RF signal transmission IC on the printed circuit board or substrate 106.

The wireless sensor module or assembly 100 is located and situated in the interior cavity 14 of the housing 12 of the module 100 in a relationship with: the bracket frame member 17b containing and housing the printed circuit board 19, the Hall Effect integrated circuit sensor 18, and the magnet 20 bracketed to a corner of one of the vertical side walls of the central interior buckle frame member 17a; the microcontroller/RF signal transmission IC housing 104 thereof abutted against and extending along the interior face of one of the vertical side walls of the base 102 of the buckle housing 102 (i.e., in a relationship with the microcontroller/RF signal transmission IC housing 104 located between the side wall of the housing base 102 and a side wall of the interior central frame member 17); the battery 130 seated against the interior floor of the housing base 102 in a relationship with the battery 130 located between the floor of the housing base 102 and the floor of the central interior buckle frame member 17a and further in a relationship with the battery 130 located between and spaced from the microcontroller/RF signal transmission IC housing 104 and the bracket frame member 17b containing and housing the printed circuit board 19, the sensor 18, and the magnet 20; the wires 132 extending between the battery 130 and the printed circuit board 106; and the wires 134 extending between the printed circuit board 19 and the printed circuit board 106.

In the embodiment shown, the printed circuit board 19 with the Hall Effect sensor integrated circuit 18 and the magnet 20 are located and positioned relative to each other in the interior slots of the bracket member 17b in a vertical overlying and spaced apart relationship relative to each other.

The primary function of the wireless sensor module 100 is to report the seatbelt buckle state (latched/buckled or unlatched/unbuckled) to the vehicle controller (not shown) via RF signal transmissions.

More specifically, the Hall Effect sensor 18 is adapted to generate an electrical signal in response to changes in the magnetic field sensed as a result of a change between the FIG. 4 and FIG. 5 buckle positions. The electrical signal generated by the Hall Effect sensor integrated circuit 18 and indicative of the latch/buckled or unlatched/unbuckled condition or position of the buckle 10 is transmitted to the microcontroller/RF signal transmitter 108 via the signal transmission wires 134 extending between the Hall Effect sensor 18 and the printed circuit board 106 containing the microcontroller/RF signal transmitter IC 108.

The microcontroller/RF signal transmitter IC 108 in turn converts the Hall Effect sensor electrical signal into an RF signal indicative of the latch or unlatched condition or position of the buckle 10 which the microcontroller/RF signal transmitter transfers and sends wirelessly to the vehicle's control unit via the RF signal transmission antenna 110 formed on the surface of the substrate 106. The RF signal is subsequently converted by the vehicle control unit into a visual and/or audible signal indicative of the latch or unlatched condition or position of the buckle 10.

Inasmuch as the wireless sensor module or assembly 100 relies on power from the internal battery 130 to perform the functions described above, power conservation is critical and the wake-up assembly of the present invention utilizes the tilt switch 112, or other suitable wake-up device, that allows the wireless sensor module or assembly 100 to remain in a low-power (idle) state until woken by motion as described in more detail below.

The tilt switch 112 incorporates one or more conductors that are moved by the force of gravity or external impulses to short two or more terminals together. The conductors are enclosed in the interior of the tilt switch 112 and not in direct contact with any external elements.

One representative example of a suitable tilt switch embodiment is a mercury tilt switch that employs a freely moving volume of mercury in a tube with two electrical terminals. Another example is a switch that employs a ball bearing in a package with two or more electrical terminals, with the terminals spaced such that it is possible for more than one to contact the ball bearing at a given time. Some tilt switches are MEMS devices that have the moving conductor partially restrained, or anchored. The tilt switch 112 may have multiple moving conductors to sense movements in different axes. The tilt switch 112 may have current draw due to leakage currents (common in MEMS and silicon-based tilt switches).

Figure 7:
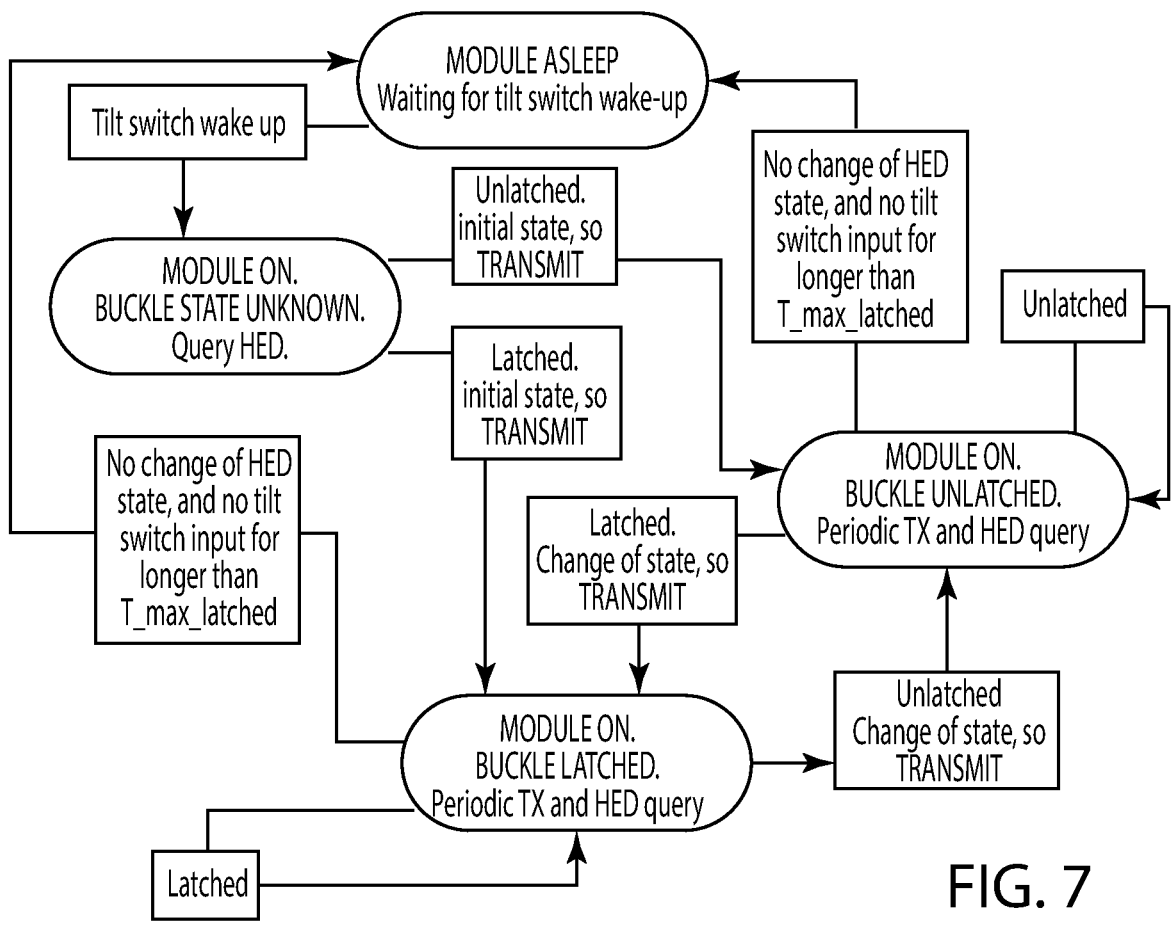
FIG. 7 is a schematic flow diagram of the operation of the wireless sensor module of the vehicle seat belt buckle shown in FIG. 1.
Figure 8:
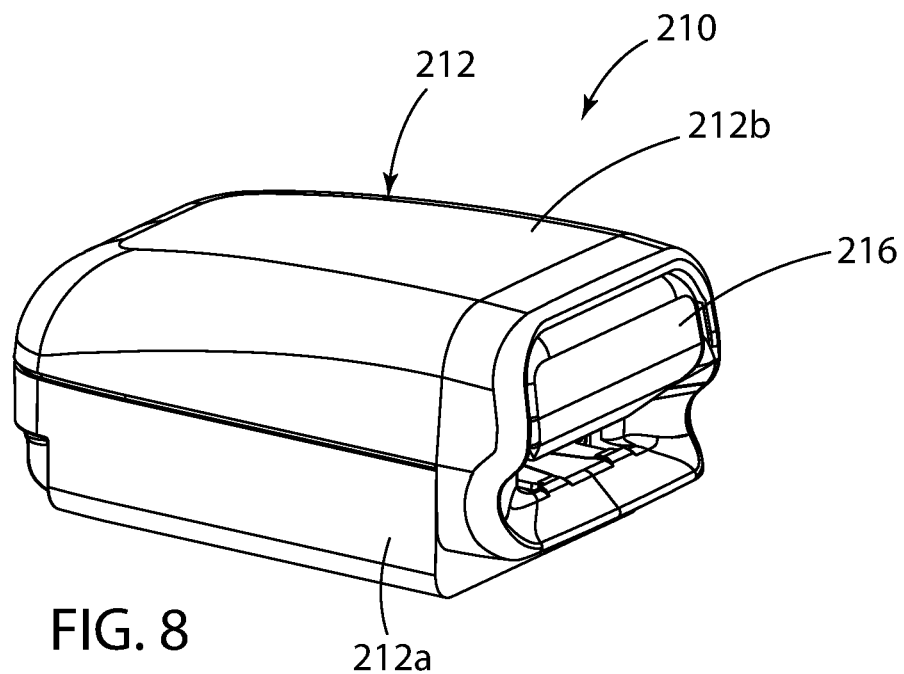
FIG. 8 is a perspective view of a buckle, and more specifically a vehicle seat belt buckle, incorporating another embodiment of a wireless latch sensor module in accordance with the present invention.

In the asleep, powered down or low power mode or idle condition of the wireless sensor module or assembly 100 as represented in the MODULE ASLEEP condition represented in the schematic of FIG. 7 and, more specifically the asleep, powered down or low power or idle mode or condition of the associated electronics of wireless sensor module or assembly 100, the microcontroller/RF signal transmission IC 108 thereof is in its most energy-efficient state. An example of this condition is when the vehicle has no occupants therein such as for example with the vehicle parked in a garage.

A change in this MODULE ASLEEP condition and more specifically a change in the MODULE ASLEEP condition resulting in the movement of the vehicle and the buckle such as for example with occupants entering the vehicle and securing their respective seat belts, the resulting motion or movement causes the movement or vibration or "wake-up" of the tilt switch 112 thereby generating an electrical signal that fluctuates between VDD and GND (battery voltage and 0V) when the buckle 10 is subjected to motion.

This fluctuating signal generated by the tilt switch 112 serves as an interrupt that causes the microcontroller IC 108 to leave its MODULE ASLEEP idle/low-power state and begin performing energy-intensive operations such as for example the energy-intensive high power MODULE ON.BUCKLE STATE UNKNOWN; MODULE ON.BUCKLE UNLATCHED; and MODULE ON.BUCKLE LATCHED control operations represented schematically in the flow diagram of FIG. 7 and described in more detail below.

In the MODULE ON. BUCKLE STATE UNKNOWN operating condition, the microcontroller IC 108 is adapted to query to the Hall Effect sensor 18 to determine whether the buckle 10 is latched or unlatched.

If the result of the Hall Effect sensor query in the MODULE ON.BUCKLE STATE UNKNOWN condition is buckle unlatched, the microcontroller 108 transfers to the MODULE ON.BUCKLE UNLATCHED operating condition as shown in FIG. 7.

If the result of the Hall Effect sensor query in the MODULE ON.BUCKLE STATE UNKNOWN condition is buckle latched, then the microcontroller IC 108 transfers to its MODULE ON.BUCKLE LATCHED operating condition as shown in FIG. 7.

Following transfer of the microcontroller IC 108 to its MODULE ON.BUCKLE UNLATCHED operating condition, the microcontroller IC 108 transmits periodic RF signals and conducts periodic queries of the Hall Effect sensor 18 to determine the state of the buckle 10.

If the result of the Hall Effect sensor queries in the MODULE ON.BUCKLE UNLATCHED operating condition is buckle latched, then the microcontroller IC 108 transfers to its MODULE ON.BUCKLE LATCHED operating condition as shown in FIG. 7.

Alternatively, if the result of the Hall Effect sensor query in the MODULE ON.BUCKLE UNLATCHED operating condition of the microcontroller IC 108 is no change in the state of the Hall Effect sensor 18 detected and there has been no tilt switch input for longer than a preselected T_max_unlatched time interval, then the microcontroller IC 108 is returned to its MODULE ASLEEP low power energy conserving operating condition as shown in FIG. 7.

Following the transfer of the microcontroller IC 108 to its MODULE ON. BUCKLE LATCHED operating condition as further shown in FIG. 7, the microcontroller IC 108 is adapted to monitor the latched state of the buckle 10 via the periodic transmission of RF signals to the vehicle control unit and periodically querying the Hall Effect sensor 18.

If the microcontroller IC 108, while in its MODULE ON.BUCKLE LATCHED operating condition, detects a change in the buckle state from latched to unlatched, then the microcontroller IC 108 returns to its MODULE ON.BUCKLE UNLATCHED operation condition and the MODULE ON.BUCKLE UNLATCHED operation is repeated.

If the microcontroller IC 108, while in its MODULE ON.BUCKLE LATCHED operating condition, detects no change in the state of the Hall Effect sensor 18 and there is no tilt switch input for longer than a preselected T_max_latched time interval, then the microcontroller IC 108 is returned to its MODULE ASLEEP energy conserving operating condition as also shown in FIG. 7.

FIGS. 8-13 depict a buckle 210, and more specifically a vehicle seat belt buckle 210, incorporating a wireless sensor assembly 1100 in accordance with the present invention for wirelessly detecting the latched/buckled or unlatched/unbuckled state or condition of the buckle 210.

The seat belt buckle 210 comprises a housing 212 including a bottom housing base 212a and a top housing cover 212b coupled together via fasteners 213 and defining an interior cavity 214 for the interior components thereof including the following: a push button buckle tongue release member or lever 216; a stationary seat belt buckle frame assembly 217 including a central frame member 217a and s sensor housing or bracket or carriage member 217b that is made of a plastic or the like molded material and coupled to a corner of one of the vertical side walls of the central frame member 17a; a Hall Effect or the like sensor integrated circuit (IC) 218 mounted on a flex circuit substrate or board portion or segment 1102d of the flex circuit 1102 of a wireless latch sensor assembly or module 1100 and is located in a first interior slot 219 of the bracket or housing member 217b; a magnet 220 located in a second interior slot 221 of the bracket or housing member 217b in a vertical relationship below and spaced from the Hall Effect sensor 218; a movable and slidable Hall Effect sensor activation or shunt plate 222; and the wireless latch sensor assembly or module 1100 as described in more detail below.

Thus, in the embodiment shown, both the lever 116 and the sensor bracket 217b are coupled to or mounted or supported by and to the frame member 17a.

Figure 11:
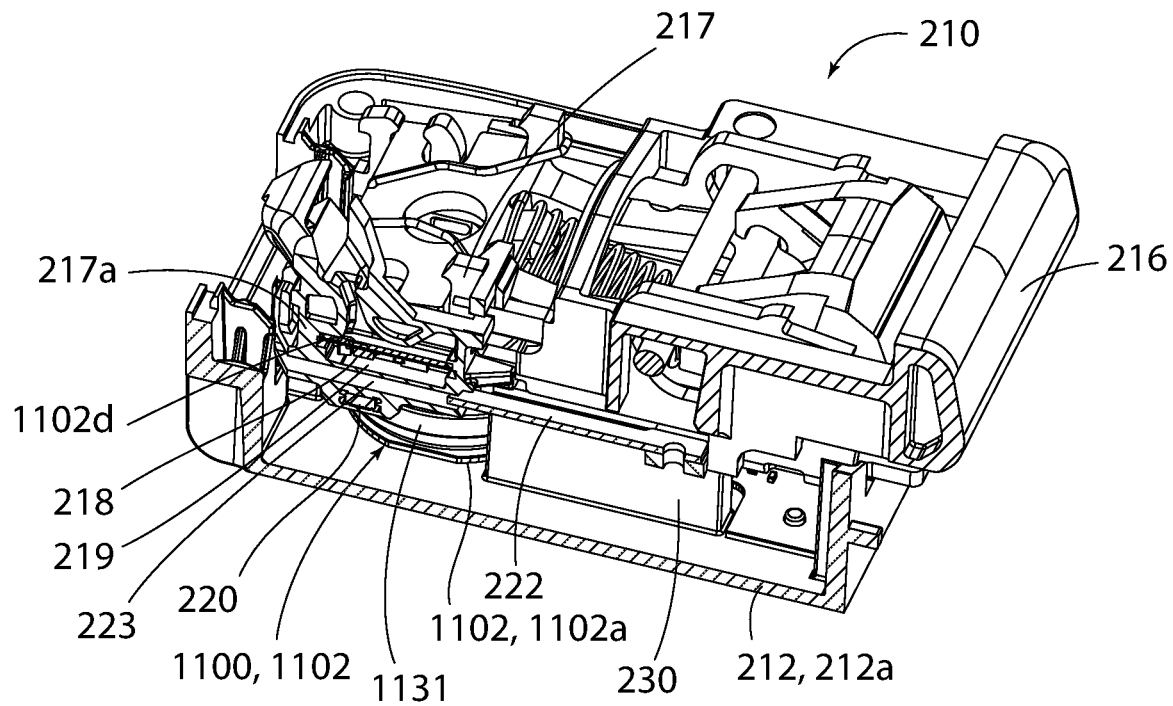
FIG. 11 is a part perspective, part vertical cross-sectional view of the buckle shown in FIG. 8 in its unlatched/unbuckled position.
Figure 12:
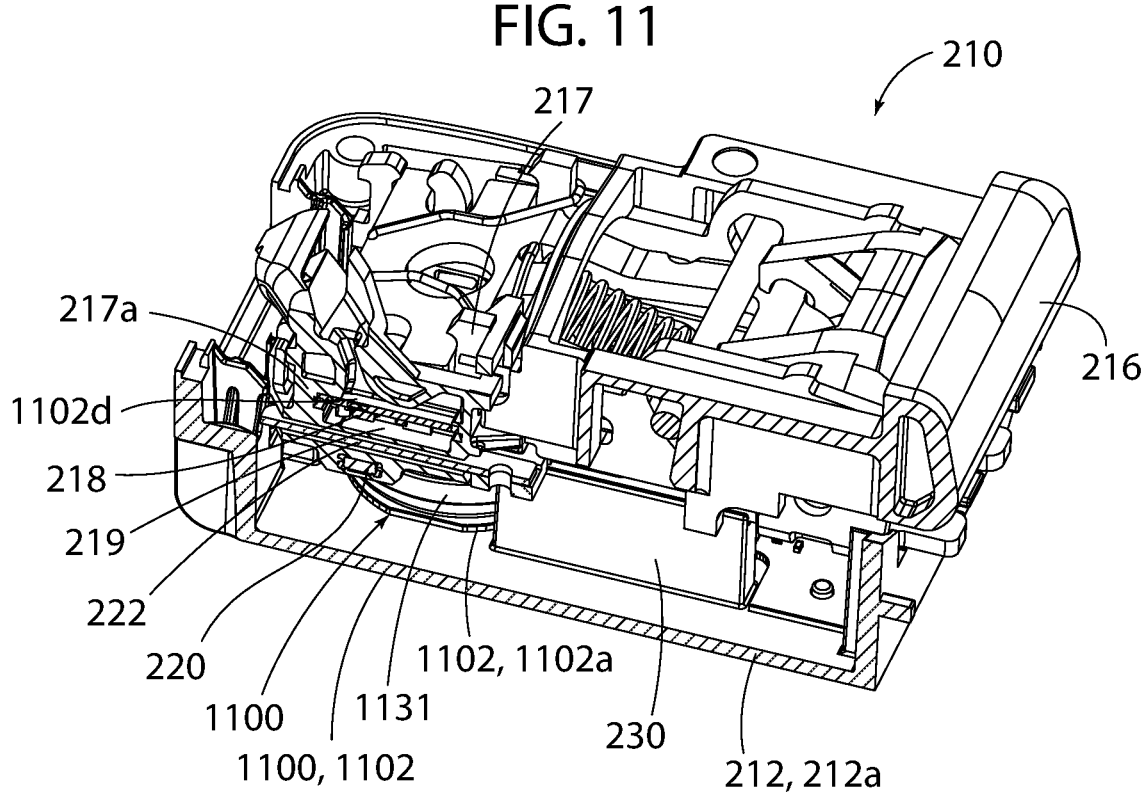
FIG. 12 is a part perspective, part vertical cross-sectional view of the vehicle seat belt buckle shown in FIG. 8 in its latched/buckled position.

The insertion of a buckle tongue (not shown) into the buckle 210 results in the movement of a shunt plate 222 from its rearward FIG. 11 buckle unlatched/unbuckled position to its forward buckle latched/buckled position as shown in FIG. 12 in which the shunt plate 222 extends into an additional slot 223 defined in the sensor housing or bracket member 217b and into a horizontal relationship with the plate 222 located between the Hall Effect sensor integrated circuit 218 and the magnet 220 positioned relative to each other in a vertical overlying and spaced apart relationship and, more specifically, into a position and relationship in which the plate 222 shields the magnetic field of the magnet 220 from the Hall Effect sensor 218.

Thus, the insertion or removal of a buckle tongue (not shown) into or from the buckle 210 results in the forward or rearward movement of the plate 222 which results in a change in the magnitude and/or direction of the magnetic field sensed by the Hall Effect integrated circuit (IC) sensor 218 which results in the generation of a vehicle latch or unlatch electrical signal.

Although the FIGS. depict a micropower Hall Effect sensor integrated circuit (IC) 218, it is understood that the buckle 210 can incorporate other suitable sensors adapted to sense the latch or unlatch conditions of the buckle 10 including, for example, a magneto resistive sensor integrated circuit.

The wireless sensor assembly 1100 in accordance with the present invention is located and housed in the interior cavity 214 of the buckle 210 and is adapted to provide a wireless RF signal transmission of the vehicle latch or unlatch signal generated by the Hall Effect sensor 218 to the vehicle's control module (not shown) including, for example in one embodiment, the RF signal receiver associated with the vehicle's TPMS system.

Figure 9:
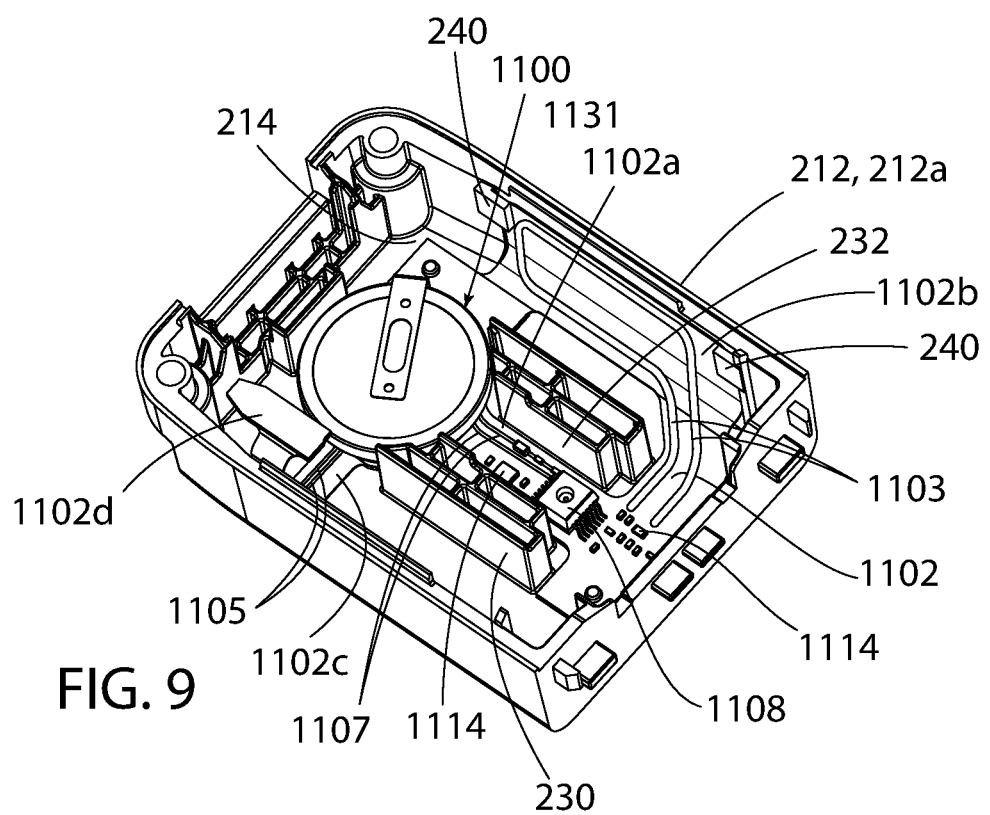
FIG. 9 is a perspective view of the buckle shown in FIG. 8 without the top housing cover.
Figure 10:
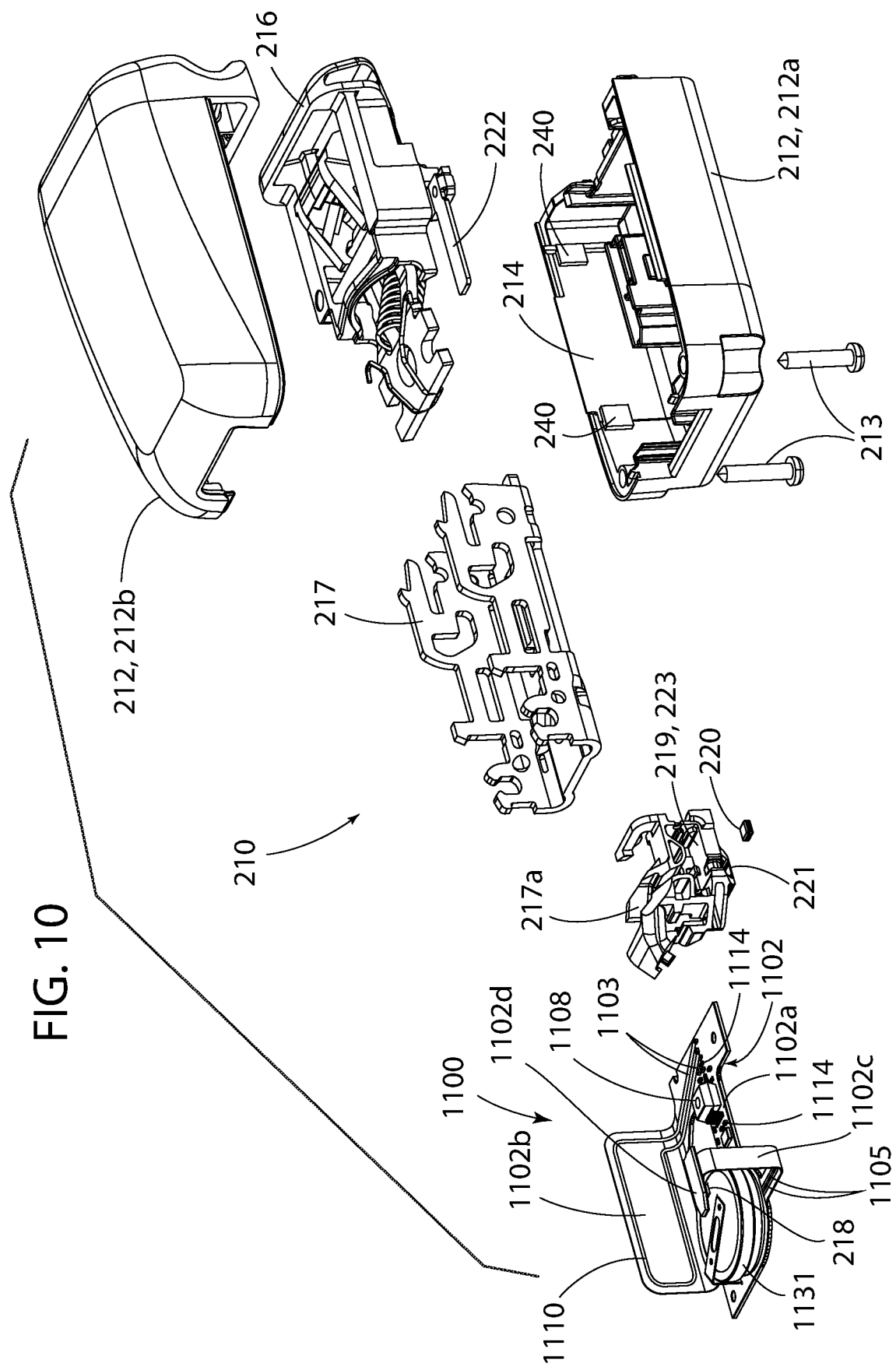
FIG. 10 is an exploded perspective view of the buckle shown in FIG. 8.
Figure 13:
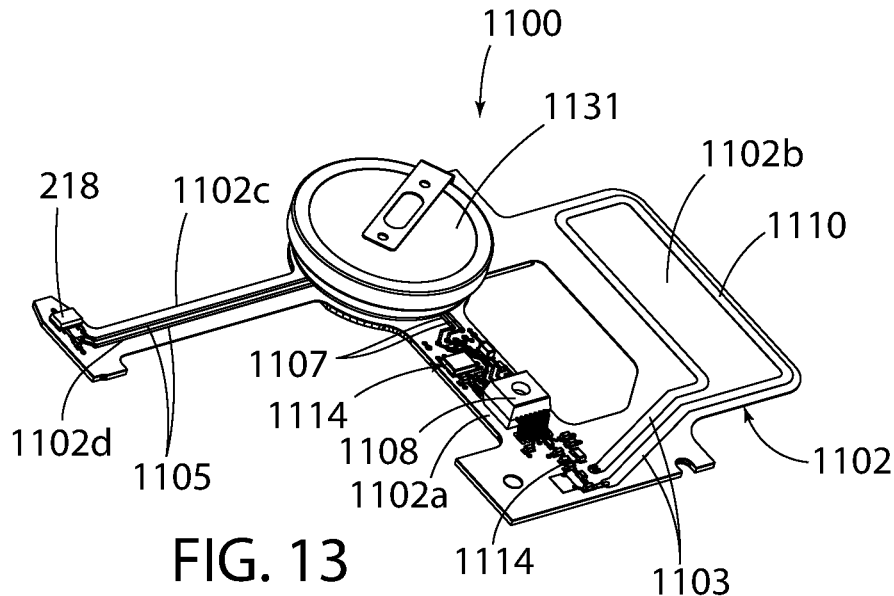
FIG. 13 is a perspective view of the wireless sensor module of the buckle shown in FIG. 8.

As shown in FIGS. 9, 10, and 13, the wireless sensor assembly 1100 comprises a flex circuit sheet or substrate 1102 located and seated in the interior cavity 214 of the buckle housing 212 against the interior face or surface of the base 212a of the buckle housing 212; a microcontroller/RF signal transmitter integrated circuit (IC) or sensor 1108 seated on the exterior top surface of the flex circuit sheet 1102: a battery 1131 also seated on the exterior top surface of the flex circuit sheet 1102; a plurality of other electrical components including, for example, resistors and capacitors 1114 also seated on the exterior top surface of the flex circuit sheet 1102; an RF signal transmission antenna 1110 formed on the exterior surface of the flex circuit sheet 102; and the Hall Effect sensor 218 also seated on the exterior top surface of the flex circuit sheet 1102.

Still more specifically, the flex circuit sheet 1102 includes a central segment or portion or section 1102a seated and abutted against the interior face or surface of the base 212a of the housing 212. The microcontroller/RF signal transmitter integrated circuit (IC) sensor 1108, the battery 1131, and a plurality of the electrical components 1114 are seated on the exterior surface of the central segment or portion 1102a of the flex circuit sheet 1102.

The flex circuit sheet 1102 also includes a pair of opposed wing segments or portions or sections 1102b and 1102c that extend unitarily outwardly from the central segment or portion 1102a.

The wing portion 1102b is generally rectangular shaped and extends in a spaced and generally parallel relationship relative to central segment or portion 1102a. The RF signal antenna 1110 is formed on the wing segment or portion 1102b. The wing segment or portion 1102b is bent at a ninety degree angle relative to the central segment or portion 1102a and is abutted against the interior face or surface of one of the vertical longitudinal side walls of the base 212a of the buckle housing 212.

The wing portion 1102c is elongate and extends unitarily generally normally outwardly from the central segment or portion 1102a. The wing portion 1102c terminates in a distal tab portion or section 1102d. The Hall Effect sensor 218 is seated on a top exterior surface or face of the distal tab portion or section 1102d. A portion of the wing 1102c is bent at a ninety degree angle relative to the central segment or portion 1102a and is abutted against the interior face or surface of the other of the vertical longitudinal side walls of the base 212a of the buckle housing 212. The distal tab portion or section 1102d extends into the slot 219 defined in the interior of the sensor housing bracket member 217a located in the interior cavity 214 of the buckle housing 212.

Clips 240 extend outwardly from the interior surface of at least the one of the vertical longitudinal side walls of the base 212a of the buckle housing 212 for holding at least the wing portion 1102b against the face of the longitudinal side wall of the base 212a of the buckle housing 212.

A first set of RF signal transmission lines 1103 are formed in the material of the flex circuit 1102 and extend between the RF signal transmission antenna 1108 formed on the wing portion 1102b and the IC 1108 and other components 1114 located on the central flex portion 1102a.

A second set of electrical signal transmission lines 1105 are formed in the material of the wing portion 1102c of the flex circuit 1102 and extend between the sensor 218 on the tab portion 1102d of the wing portion 1102c and the battery 1131 on the central portion 1102a.

A third set of electrical power transmission lines 1107 are formed in the material of the central portion 1102a of the flex circuit 1102 and extend between the battery 1131 on the central portion 1102a and the IC 1108 and other components 1114 also located on the central flex portion 1102a.

The microcontroller/RF signal transmission IC sensor 1108 is adapted for at least the following functions: timing and power management; data acquisition from on-board sensors; logic control; RF signal control; on-board diagnostics; and transmission of RF signals through the RF signal transmission lines 1103 and the RF signal transmission antenna 1110 and then into an RF signal receiver (not shown) in a vehicle's controller (not shown).

The microcontroller/RF signal transmission IC 1108 and associated electronics 1114 and the sensor 218 on the flex circuit sheet 1102 are powered by the battery or coil cell 1131.

In the embodiment shown, the central flex portion 1102a and the sensor IC 1108 are located in the interior cavity 214 of the housing 212 between a pair of opposed, spaced apart, and parallel vertical housing walls 230 and 232 extending unitarily normally outwardly from the interior surface of the base 212a of the buckle housing 212 in a relationship parallel to the opposed vertical longitudinal side walls of the base 212a of the buckle housing 212. The walls 230 and 232 shield the microcontroller/RF signal transmission IC 1108 from the Hall Effect sensor 218 and the RF signal transmission antenna 1110.

The primary function of the wireless sensor assembly 1100 is to report the seatbelt buckle state (latched or unlatched) to the vehicle controller (not shown) via RF signal transmissions.

More specifically, and as described above, the Hall Effect sensor integrated circuit (IC) 218 generates an electrical signal in response to changes in the magnetic field sensed as a result of a change between the FIGS. 11 and 12 buckle positions. The electrical signal generated by the Hall Effect sensor 218 and indicative of the latch or unlatched condition of the buckle 210 is transmitted to the microcontroller/RF signal transmitter 1108 via the signal transmission wires 1105 and 1107.

The microcontroller/RF signal transmitter IC 1108 in turn converts the Hall Effect sensor electrical signal into an RF signal indicative of the latch or unlatched condition of the buckle 210 which the microcontroller/RF signal transmitter IC 1108 transfers and sends to a vehicle's control unit via the flex circuit transmission lines 1103 and the RF signal transmission antenna 1110 formed on the wing portion 1102b of the flex circuit 1102 of the wireless sensor assembly 1100. The RF signal is subsequently converted by the vehicle control unit into a visual and/or audible signal indicative of the latch or unlatched condition of the buckle 210.

Figure 14:
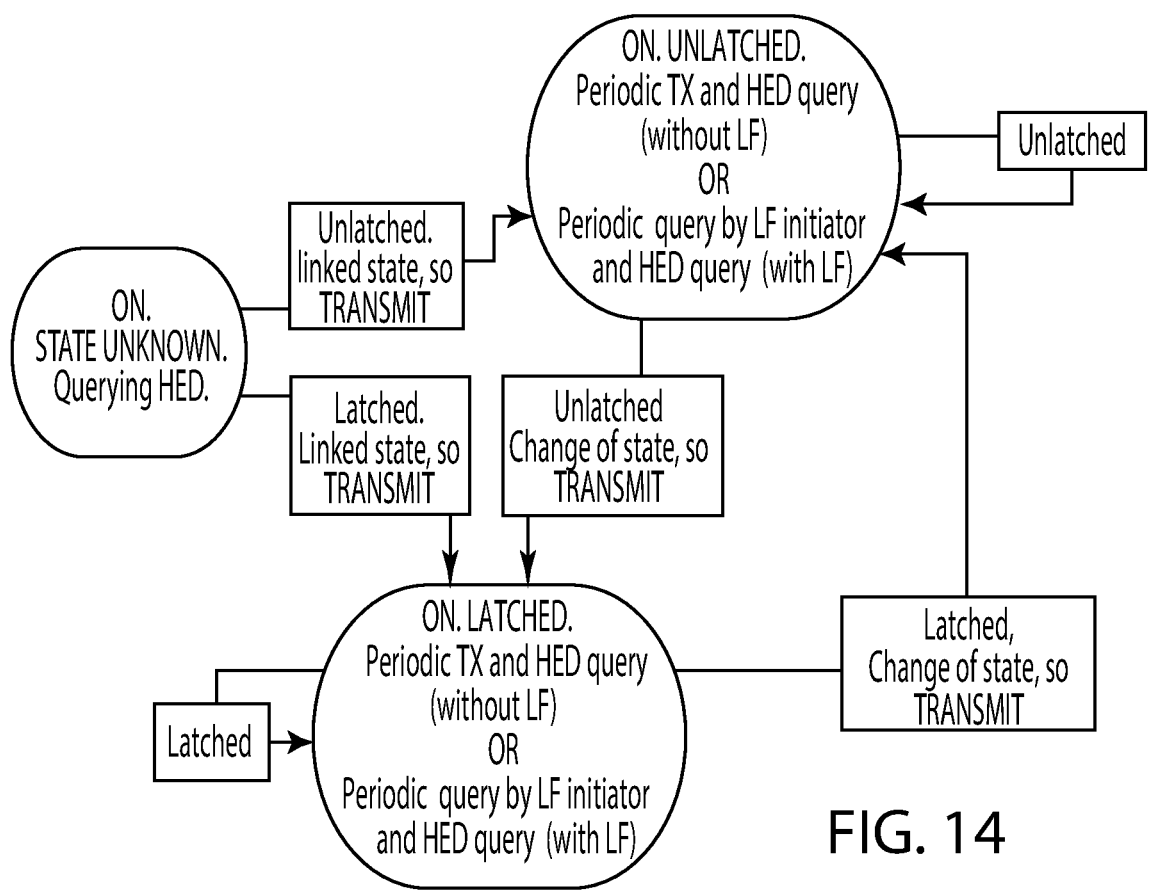
FIG. 14 is a schematic flow diagram of the operation of the wireless sensor module of the buckle shown in FIG. 8.
Figure 15:
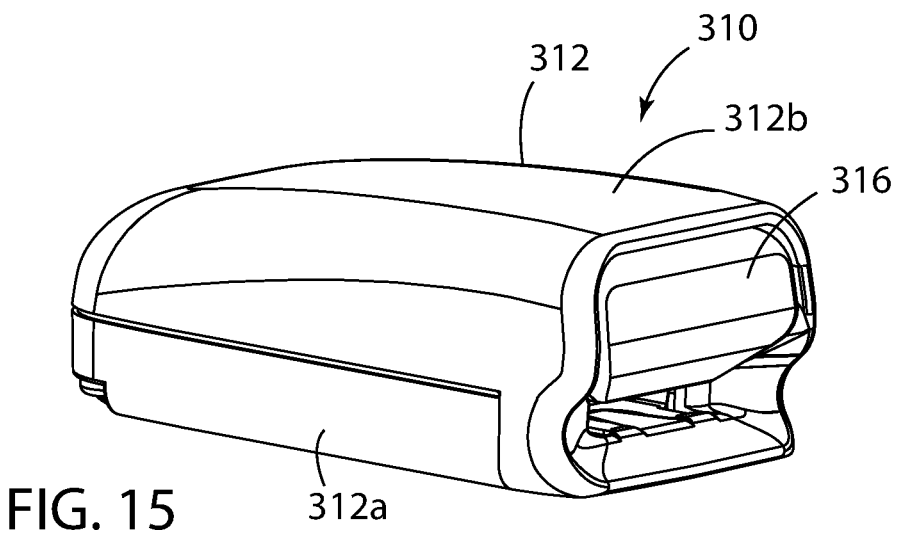
FIG. 15 is a perspective view of a buckle, and more specifically a vehicle seat belt buckle, incorporating a further embodiment of a wireless latch sensor module in accordance with the present invention.
Figure 16:
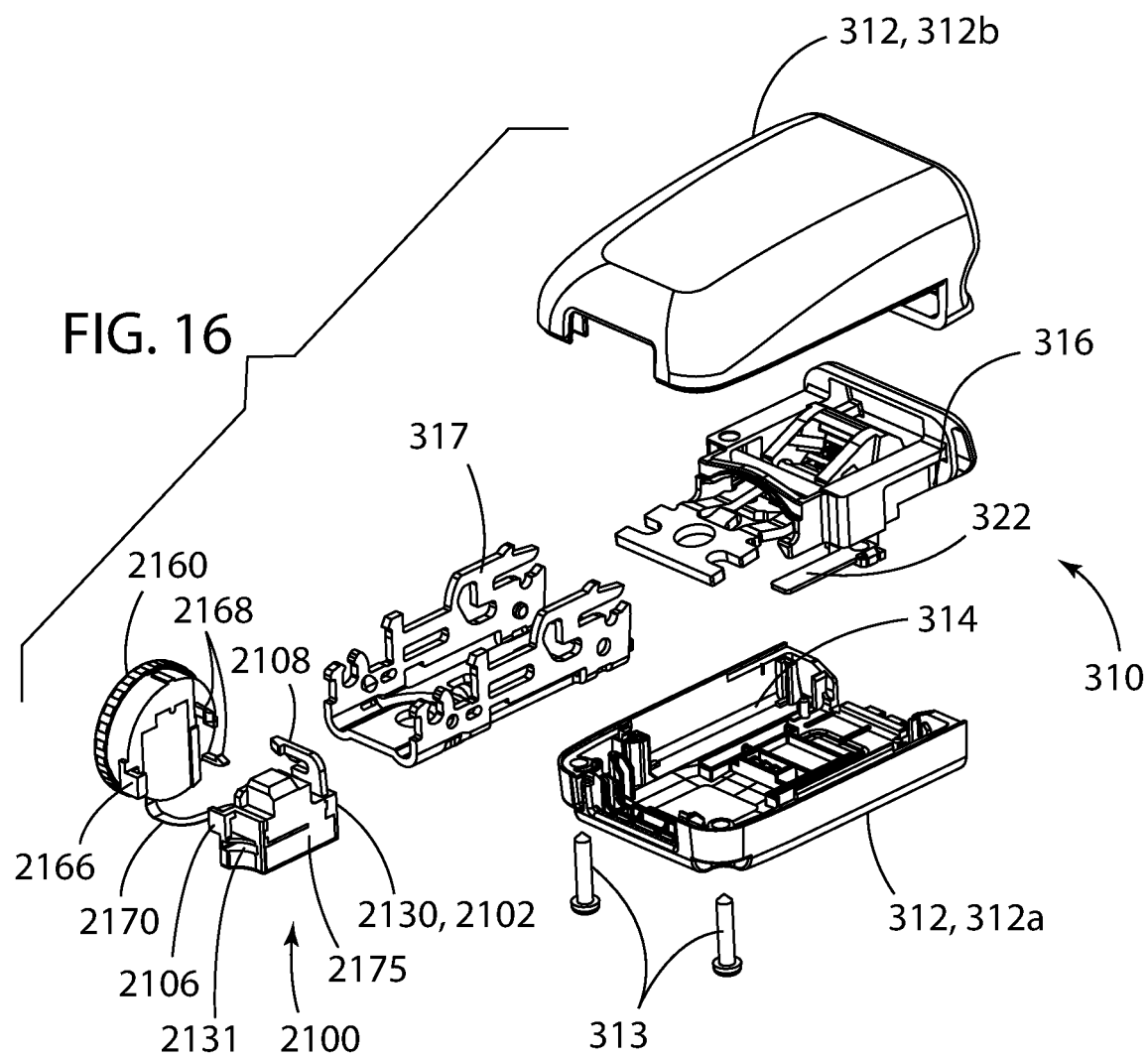
FIG. 16 is an exploded perspective view of the buckle shown in FIG. 15.

FIG. 14 is a flow chart depicting the mode of operation of the buckle 210 and more specifically the wireless sensor assembly 1100 thereof.

In the ON. STATE UNKNOWN operating condition, the microcontroller 1108 is adapted to query to the Hall Effect sensor 218 to determine whether the buckle 210 is latched or unlatched.

If the result of the Hall Effect sensor query in the ON. STATE UNKNOWN condition is buckle unlatched, the microcontroller 1108 transfers to the ON. UNLATCHED operating condition.

If the result of the Hall Effect sensor query in the ON. STATE UNKNOWN condition is buckle latched, then the microcontroller 1108 transfers to its ON. LATCHED operating condition.

Following transfer of the microcontroller 1108 to its ON.UNLATCHED operating condition, the microcontroller 1108 transmits periodic RF signals and conducts periodic queries of the Hall Effect sensor 218 to determine the state of the buckle 110.

If the result of the Hall Effect sensor queries in the ON.UNLATCHED operating condition is buckle latched, then the microcontroller 1108 transfers to its ON.LATCHED operating condition.

Following the transfer of the microcontroller 1108 to its ON. BUCKLE LATCHED operating condition, the microcontroller 1108 is adapted to monitor the latched state of the buckle 210 via the periodic transmission of RF signals to the vehicle control unit and periodically querying the Hall Effect sensor 218.

If the microcontroller 1118, while in its ON.LATCHED operating condition, detects a change in the buckle state from latched to unlatched, then the microcontroller 1118 returns to its ON.UNLATCHED operation condition and the ON. UNLATCHED operation is repeated.

FIGS. 15-23 depict a buckle 310, and more specifically a vehicle seat belt buckle 310, including a further embodiment of a wireless seat belt buckle latch sensor assembly 2100 in accordance with the present invention.

The seat belt buckle 310 comprises a housing 312 including a bottom housing base 312a and a top housing cover 312b coupled together via fasteners 313 and defining an interior cavity 314 for the interior components thereof including a push button buckle tongue release member or lever 316 coupled to an interior frame member 317; and a movable and slidable Hall Effect sensor activation or shunt plate 322; and the wireless latch sensor assembly or module 2100 as described in more detail below.

Figure 17:
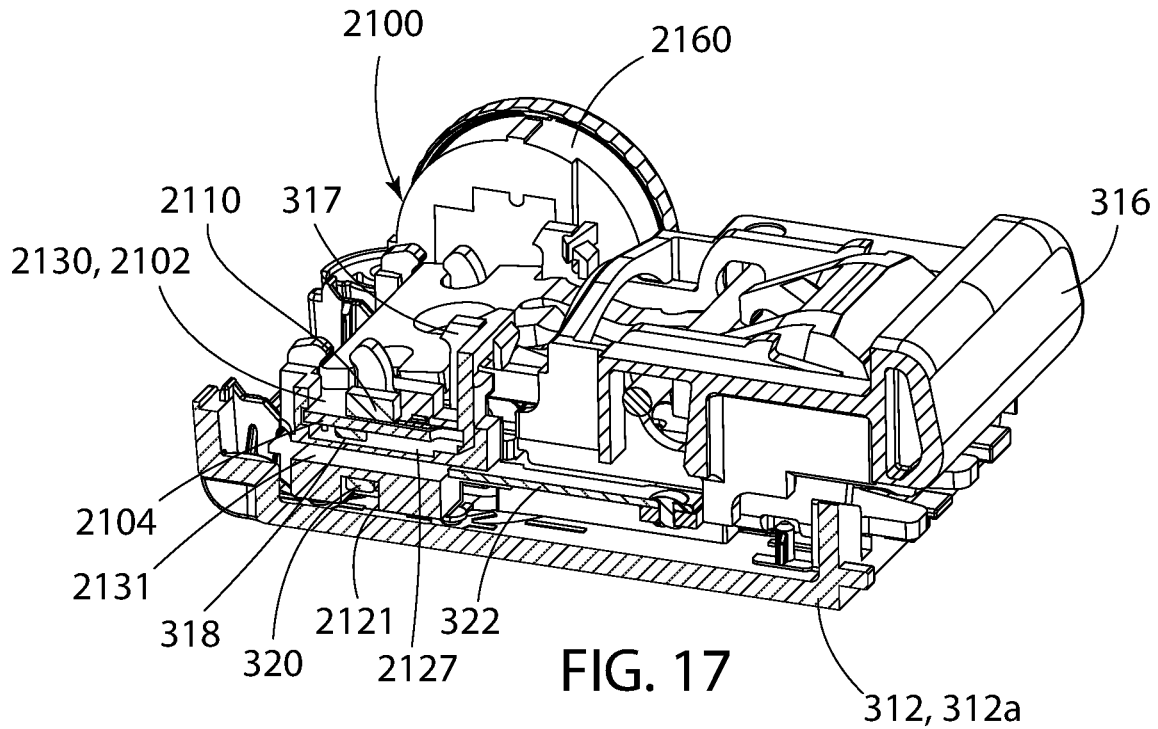
FIG. 17 is a part perspective, part vertical cross-sectional view of the buckle shown in FIG. 15 in its unlatched/unbuckled position.
Figure 18:
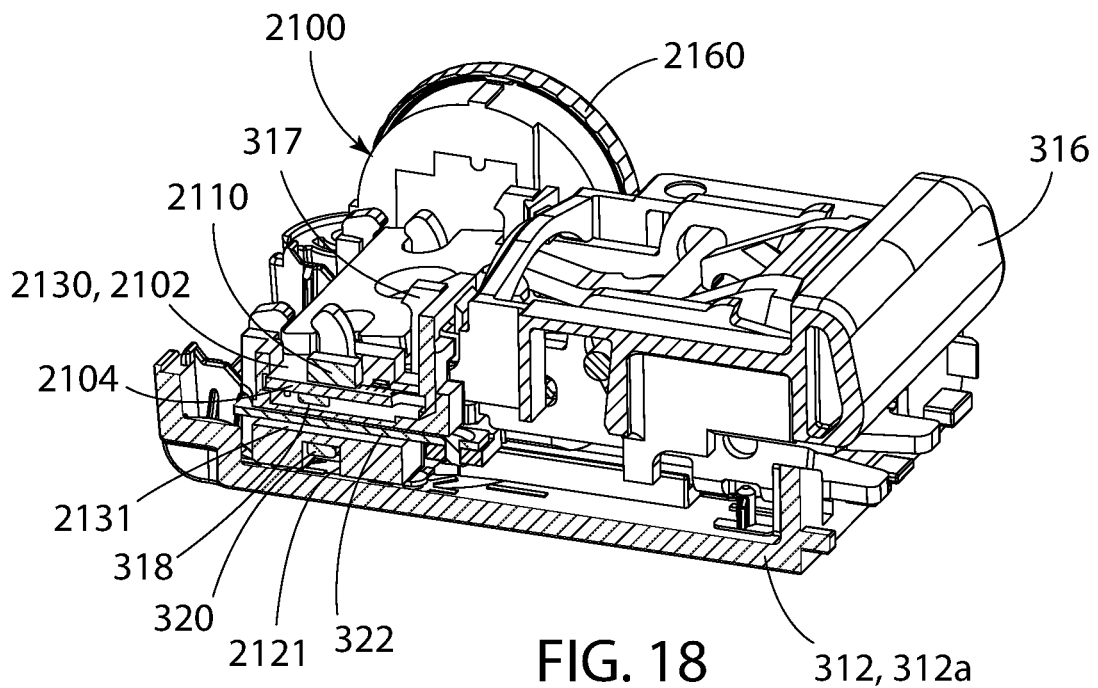
FIG. 18 is a part perspective, part vertical cross-sectional view of the vehicle seat belt buckle shown in FIG. 15 in its latched/buckled position.
Figure 19:
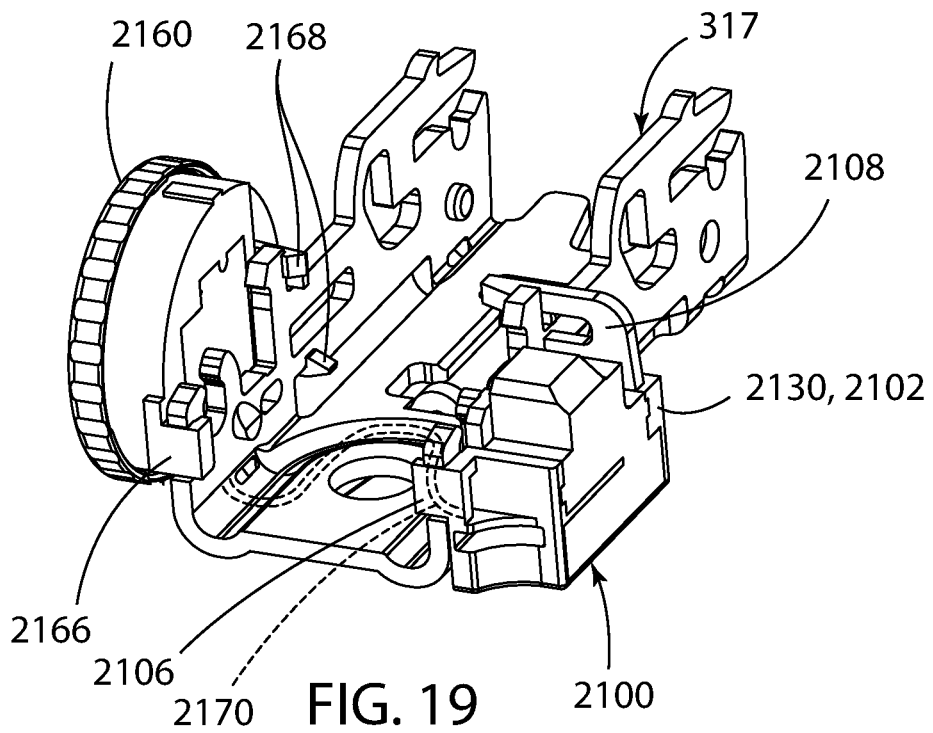
FIG. 19 is a perspective view of the wireless latch sensor module coupled to the interior frame of the buckle.
Figure 20:
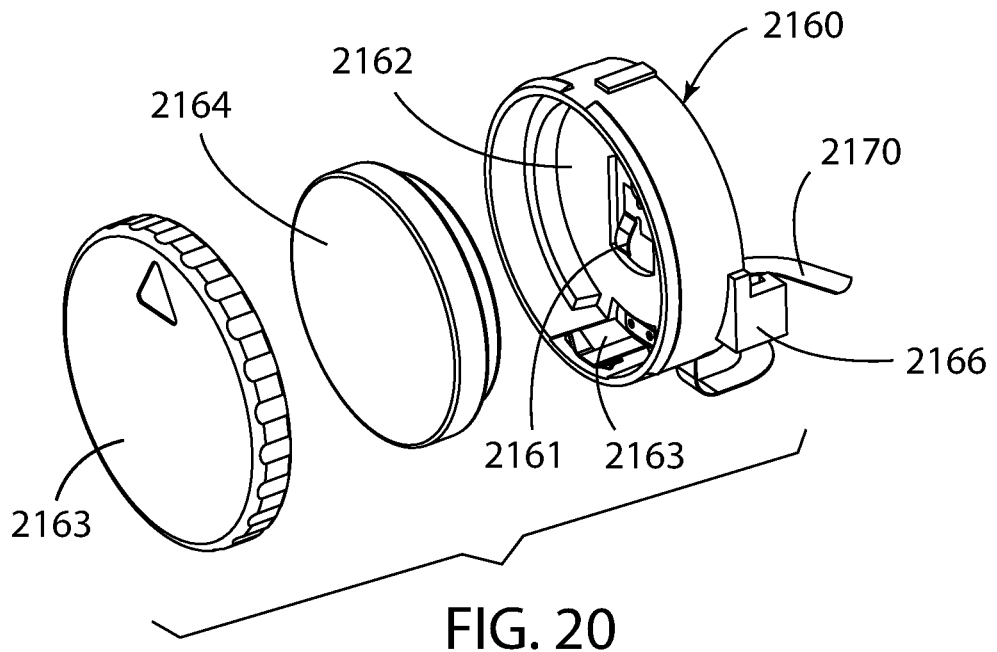
FIG. 20 is an exploded perspective view of the battery module of the wireless latch sensor assembly shown in FIG. 19.
Figure 21:
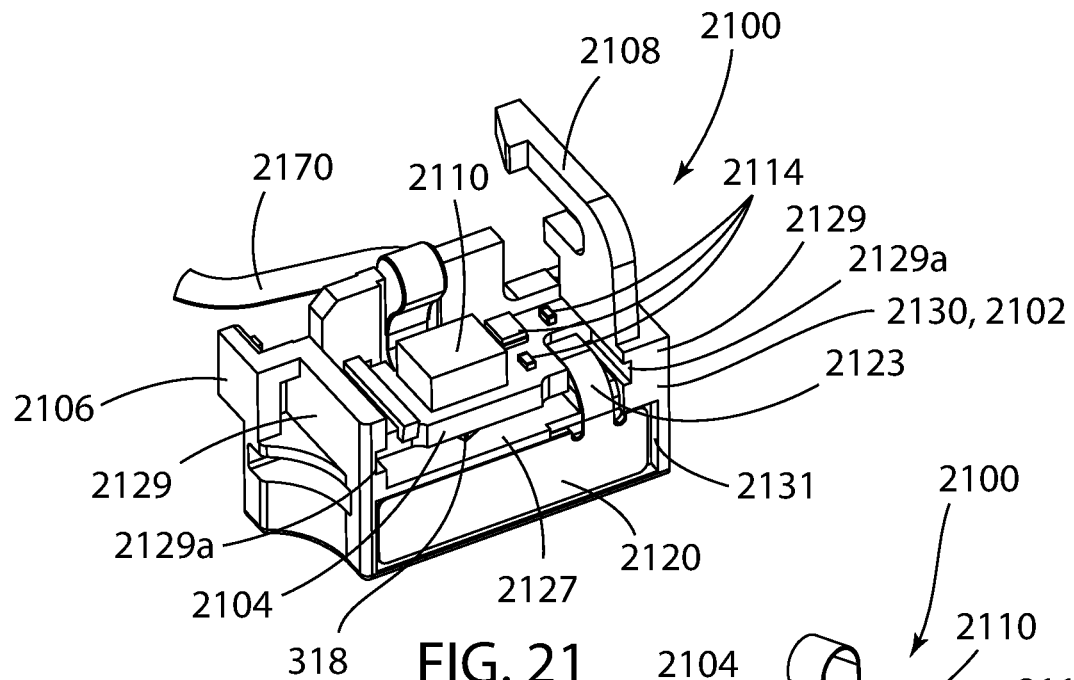
FIG. 21 is a broken, part perspective view of the wireless latch sensor module shown in FIG. 19.
Figure 22:
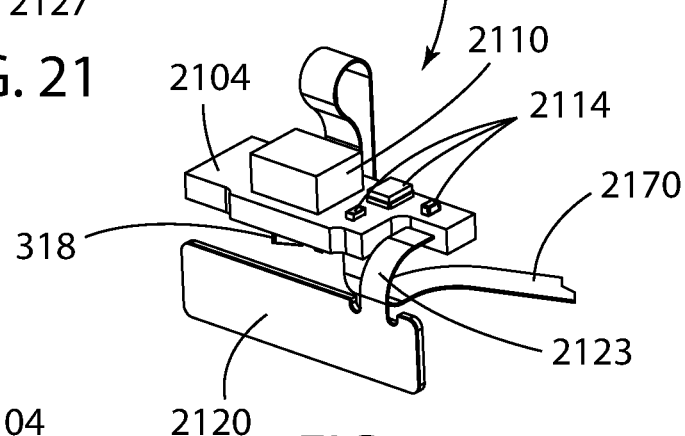
FIG. 22 is a broken perspective view of the wireless latch sensor module separated from the housing thereof.
Figure 23:
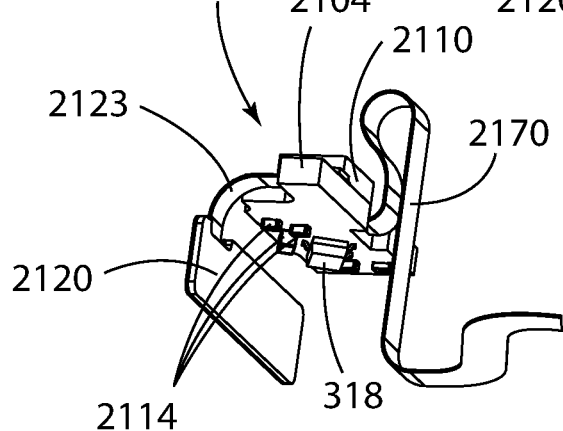
FIG. 23 is another broken perspective view of the wireless sensor module separated from the housing thereof.

The insertion of a buckle tongue (not shown) into the buckle 310 results in the movement of the plate 322 from its rearward buckle unlatched/unbuckled position as shown in FIG. 17 to its forward buckle latched/buckled position as shown in FIG. 18 in which the plate 322 is located in a horizontal relationship between a Hall Effect sensor integrated circuit (IC) 318 and a magnet 320 which are positioned relative to each other in a vertical overlying spaced apart relationship and, more specifically, into a position in which the plate 322 shields the magnetic field of the magnet 320 from the Hall Effect sensor 318.

The insertion or removal of a buckle tongue (not shown) into or from the buckle 310 thus results in the forward or rearward horizontal movement of the plate 322 which results in a change in the magnitude and/or direction of the magnetic field sensed by the Hall Effect sensor 318 which results in the generation of a vehicle latch or unlatch signal.

Although the FIGS. depict a micropower Hall Effect sensor 318, it is understood that the vehicle buckle 310 can incorporate other suitable sensors adapted to sense the latch or unlatch conditions of the buckle 10 including, for example, a magneto-resistive sensor.

The wireless sensor assembly 2100 in accordance with the present invention is adapted to provide a wireless RF signal transmission of the vehicle latch or unlatch signal generated by the Hall Effect sensor 318 to the vehicle's control module (not shown) including, for example in one embodiment, the RF signal receiver associated with the vehicle's TPMS system.

The wireless sensor assembly 2100 comprises a wireless sensor housing or bracket or carriage member 2130 that is made of a plastic or the like molded material and is coupled to, and extends outwardly from, a first exterior vertical side face or wall of the seat belt buckle housing channel/frame 317 and a battery housing or member or assembly or carriage 2160 coupled to, and extending outwardly from, a second opposed exterior vertical side face or wall of the seat belt buckle housing channel/frame 317 in a relationship and position diametrically opposed to the wireless sensor housing 2130.

Electrical flex circuit power transmission lines 2170 extend between the wireless sensor housing or bracket member 2130 and the battery housing 2160. In the embodiment shown, the flex circuit power transmission lines 2170 extend along the lower exterior surface or face of the seat belt buckle housing channel/frame 317.

The wireless sensor housing 2130 is in the form of a block 2102 of plastic or the like molded material defining at least three interior slots, recesses, or receptacles 2121, 2127, and 2131. The block 2102 includes and defines a pair of brackets 2106 and 2108 adapted for bracketing or securing the block 2102 and thus the wireless sensor housing or bracket member 2130 to the channel/frame 317 of the housing 312 of the buckle 310.

The wireless sensor assembly 2100 further comprises a printed circuit board or substrate 2104 seated and located in the block 2102 of the sensor housing or bracket member 2130. A microcontroller/RF signal transmission integrated circuit (IC) 2110 is seated on the exterior upper surface of the printed circuit board or substrate 2104. Other electrical components including but not limited to for example resistors and capacitor components 2114 are also seated on the exterior upper surface of the printed circuit board or substrate 2104. The Hall Effect sensor 318 is mounted on the exterior lower surface of the printed circuit board or substrate 2104. Thus, the sensor integrated circuit 318 and RF integrated circuit 2110 are located on the opposed top and bottom exterior faces of the substrate 2104. In another embodiment, the sensor and RF integrated circuits 318 and 2110 are combined into a single integrated circuit incorporating both a sensor integrated circuit and an RF integrated circuit and located on one of the exterior surfaces of the substrate 2104. Other electrical components including for example additional resistors and capacitors 2114 are also mounted on the exterior lower surface of the printed circuit board or substrate 2104.

The wireless sensor assembly 2100 still further comprises an RF signal transmission antenna 2120 that is made of and formed on a generally rectangular piece or segment or portion or section of flex circuit material 2120 including a unitary projection or strip 2123 extending outwardly therefrom and into electrical coupling relationship with the printed circuit board or substrate 2104.

Opposed ends of the printed circuit board or substrate 2104 are slid into respective opposed slots 2129a defined in respective opposed vertical side walls 2129 of the block 2102 of the sensor housing or bracket member 2130 in a relationship with the printed circuit board or substrate 2104 located horizontally in a recess or receptacle 2127 defined in the body of the block 2102 of the sensor housing or bracket member 2130 and the flex circuit material 2120 forming the RF signal transmission antenna 2120 abutted against and extending in a vertical relationship into a rectangular recess 2131 defined in an exterior vertical side wall or face of the block 2102 of the sensor housing or bracket member 2130 and further into a relationship covering the interior slot 2121 which houses the magnet 318.

The magnet 320 is mounted in the slot or recess or receptacle 2121 defined in the block 2102 of the sensor housing 2130.

The sensor housing 2130 and, more specifically, the block 2102 thereof further defines an elongate slot 2131 adapted to receive the elongate shunt plate 322.

In the embodiment shown, the slot 2131 is located between and spaced vertically from the magnet 320 and the printed circuit board 2104 and, more specifically, the slot 2131 is located vertically between and separates the Hall Effect sensor 318 from the magnet 320 to shunt or block the magnetic field generated by the magnet 320 when the plate 322 is slid into the slot 2131.

Thus, in the embodiment shown, the respective slots 2127, 2131 and 2121 are positioned relative to each other in the interior of the block 2102 in a vertical overlying relationship. Moreover, the substrate 2104, the sensor integrated circuit 320, the RF integrated circuit 2110, and the magnet 320 are all positioned and located in the interior of the block 2102 in a vertical overlying and spaced apart relationship relative to each other.

The wireless sensor assembly 2100 still further comprises the battery module or housing or assembly or bracket 2160 which defines a generally round receptacle or housing 2162 for a round battery or power cell 2164 and includes interior battery terminals 2161 and 2163. The battery module 2160 also includes a cover 2163. A pair of bracket members 2166 and 2168 extend unitarily outwardly from the battery housing 2162 and are adapted for coupling and securing the battery module 2160 to the channel/frame 317 of the buckle housing 310 in a relationship diametrically opposed to the wireless sensor housing or bracket member 2130.

The wireless sensor assembly 2100 still further comprises an elongate strip of flex circuit material 2170 that includes a first end coupled to the terminals 2161 and 2163 in the interior of the battery housing 2162 and an opposed end coupled to the printed circuit board 2104 in the wireless sensor housing 2130. In the embodiment shown, the flex circuit 2170 extends below, and the width of, the channel/frame 317 of the seat belt buckle 310.

A hot melt material 2175 is applied to the exterior of the body 2102 of the block 2102 of the wireless sensor housing 2130 for encapsulating and protecting the printed circuit board 2104, the electrical components on the printed circuit board 2104 including the microcontroller IC sensor 2110, the components 2114 mounted to the top and bottom surfaces of the printed circuit board 2104, the Hall Effect sensor 318, the magnet 320, and the RF signal transmission antenna 2120.

In accordance with the present invention, the microcontroller/RF signal transmission IC 2110 is adapted for at least the following functions: timing and power management; data acquisition from on-board sensors; logic control; RF signal control; on-board diagnostics; and transmission of RF signals from the microcontroller/RF signal transmission IC 2110 into the antenna 2120 and then into an RF signal receiver (not shown) in a vehicle's controller (not shown).

The microcontroller/RF signal transmission IC 2110, the Hall Effect sensor integrated circuit 318, and associated electronics on the printed circuit board or substrate 2104 are powered by the battery or coil cell 2164 via the power transmission flex circuit 2170.

The primary function of the wireless sensor assembly 2100 is to report the seatbelt buckle state (latched or unlatched) to the vehicle controller (not shown) via RF signal transmissions.

More specifically, and as described above, the Hall Effect sensor integrated circuit (IC) 318 generates an electrical signal in response to changes in the magnetic field sensed as a result of a change between the FIG. 17 buckle unlatched position in which the magnetic field generated by the magnet 320 is sensed by the Hall Effect sensor 318 and the FIG. 18 buckle latched position in which the shunt plate 322 is extended and slid horizontally forwardly into the slot 2131 defined in the block 2102 of the sensor housing 2130 in a relationship in which the plate 322 is located between the Hall Effect sensor 318 and the magnet 320 and is adapted to block the magnetic field generated by the magnet 320 from being sensed by the Hall Effect sensor 318.

The electrical signal generated by the Hall Effect sensor 318 and indicative of the latch or unlatched condition of the buckle 310 is transmitted to the microcontroller/RF signal transmitter 2110 on the printed circuit board or substrate 2104 via RF signal transmission lines formed on the printed circuit board or substrate 2104 and extending between the microcontroller/RF signal transmitter 2110 and the Hall Effect sensor 318.

The microcontroller/RF signal transmitter 2110 in turn converts the Hall Effect sensor electrical signal into an RF signal indicative of the latch or unlatched condition of the buckle 310 which the microcontroller/RF signal transmitter sensor 2110 transfers and sends wirelessly to the vehicle's control unit via the flex circuit RF signal transmission line 2123 extending between the printed circuit board 2104 and the RF signal transmission antenna 2110. The RF signal is sent wirelessly via the RF signal transmission antenna 2110 to the vehicle's control unit and subsequently converted by the vehicle control unit into a visual and/or audible signal indicative of the latch or unlatched condition of the buckle 310.

FIG. 14 is a flow chart depicting the mode of operation of the buckle 310 and more specifically the wireless sensor assembly 2100 thereof.

Initially, it is understood that the present invention also includes an embodiment of the sensor assembly 2100 in which the RF integrated circuit 2110 and sensor assembly 2100 includes a low frequency (LF) initiator or receiver, and associated components including for example an LF antenna and additional capacitors and/or resistors, for the purpose of allowing the RF microcontroller 2110 to remain in a sleep mode until the RF microcontroller 2110 receives a wake-up signal via the LF receiver from the vehicle control unit at which point the RF microcontroller 2110 would enter a high power mode and transmit the buckle state. The use of an LF receiver advantageously decreases the power requirements and allows for the use of a smaller battery.

Thus, and referring to FIG. 14, In the ON. STATE UNKNOWN operating condition of the sensor assembly 2100, the microcontroller 2110 is adapted to query the Hall Effect sensor 318 to determine whether the buckle 310 is latched or unlatched.

If the result of the Hall Effect sensor query in the ON. STATE UNKNOWN condition is buckle unlatched, the RF integrated circuit/microcontroller 2110 transfers to the ON.UNLATCHED operating condition.

If the result of the Hall Effect sensor query in the ON. STATE UNKNOWN condition is buckle latched, then the microcontroller 2110 transfers to its ON.LATCHED operating condition.

Following transfer of the microcontroller 2110 to its ON.UNLATCHED operating condition, the microcontroller 2110 transmits periodic RF signals and conducts periodic queries of the Hall Effect sensor 318 to determine the state of the buckle 310. In the embodiment including the LF initiator/receiver, the LF initiator/receiver conducts periodic queries of the Hall Effect sensor 318 to determine the state of the buckle 310.

If the result of the Hall Effect sensor queries in the ON.UNLATCHED operating condition is buckle latched, then the microcontroller 2110 transfers to its ON.LATCHED operating condition.

Following the transfer of the microcontroller 2110 to its ON. BUCKLE LATCHED operating condition, the microcontroller 2110 is adapted to monitor the latched state of the buckle 310 via the periodic transmission of RF signals to the vehicle control unit and periodically querying the Hall Effect sensor 318. In the embodiment including the LF initiator/receiver, the LF initiator/receiver conducts periodic queries of the Hall Effect sensor 318 to determine the state of the buckle 310.

If the microcontroller 2110, while in its ON.LATCHED operating condition, detects a change in the buckle state from latched to unlatched, then the microcontroller 318 returns to its ON.UNLATCHED operation condition and the ON.UNLATCHED operation is repeated.

Numerous variations and modifications of the buckle, and more specifically the vehicle seat belt buckle, with a wireless sensor in accordance with the present invention for detecting the buckled or unbuckled state of the buckle may be effected without departing from the spirit and scope of the novel features of the invention. It is to be understood that no limitations with respect to the specific wireless sensor illustrated herein are intended or should be inferred. It is, of course, intended to cover by the appended claims all such modifications and embodiments as fall within the scope of the claims.

What is claimed is:

1. A buckle comprising:
   a sensor integrated circuit in the buckle for sensing a buckled or unbuckled condition of the buckle and generating an electrical signal indicative of the buckled or unbuckled condition of the buckle, the sensor integrated circuit being a Hall Effect sensor and further comprising a magnet in the buckle, the Hall Effect sensor sensing changes in the magnetic field of the magnet in response to a change in the buckled or unbuckled condition of the buckle;
   a RF integrated circuit in the buckle for receiving the electrical signal generated by the sensor integrated circuit and generating an RF signal indicative of the buckled or unbuckled condition of the buckle;
   a battery in the housing for providing power to the sensor and RF integrated circuits; and
   an RF signal antenna in the buckle, the RF integrated circuit being an integrated circuit incorporating a microcontroller and an RF signal transmitter for transmitting the RF signal to the RF signal antenna,
   the microcontroller being operable between low power and high power conditions and further comprising a movement activated device for switching the microcontroller between the low power and high power conditions.

2. The buckle of claim 1 wherein the device for switching the microcontroller between the low power and high power conditions comprises a tilt switch mounted on the printed circuit board of the module and operably coupled to the microcontroller.

3. The buckle of claim 1 further comprising a bracket in the buckle for the sensor integrated circuit and the magnet.

4. The buckle of claim 3 wherein the RF integrated circuit is located on the bracket.

5. The buckle of claim 4 further comprising a substrate on the bracket, the sensor and RF integrated circuits being mounted to the substrate.

6. The buckle of claim 1 further comprising a frame in the buckle and a bracket for mounting the battery to the frame.

7. The buckle of claim 1 further comprising a flex circuit in the buckle, the sensor and RF integrated circuits and the battery being located on the flex circuit.

8. A vehicle seat belt buckle comprising:
   a sensor integrated circuit in the buckle for sensing a buckled or unbuckled condition of the buckle and generating an electrical signal indicative of the buckled or unbuckled condition of the buckle;
   a RF integrated circuit in the buckle for receiving the electrical signal generated by the sensor integrated circuit and generating an RF signal indicative of the buckled or unbuckled condition of the buckle; and
   a battery in the housing for providing power to the sensor and RF integrated circuits;
   a bracket in the buckle for the sensor integrated circuit and the magnet; and
   an interior frame and a shunt plate in the buckle extendable into the first bracket into a relationship located between the sensor integrated circuit and the magnet for blocking the magnetic field generated by the magnet.

9. A vehicle seat belt buckle comprising:
   a sensor integrated circuit in the buckle for sensing a buckled or unbuckled condition of the buckle and generating an electrical signal indicative of the buckled or unbuckled state of the buckle;
   a RF integrated circuit in the buckle for receiving the electrical signal generated by the sensor integrated circuit and generating an RF signal indicative of the buckled or unbuckled condition of the buckle;
   an RF signal antenna in the buckle for transmitting the RF signal generated by the RF integrated circuit;
   a first bracket in the buckle for the sensor and RF integrated circuits and the RF signal antenna;
   a battery in the buckle for providing power to the sensor and RF integrated circuits,
   the sensor integrated circuit being a Hall Effect sensor and further comprising a magnet on the first bracket in the buckle, the Hall Effect sensor sensing changes in the magnetic field of the magnet in response to a change in the buckled or unbuckled condition of the buckle, the RF integrated circuit being an integrated circuit incorporating a microcontroller and an RF signal transmitter; and
   an interior frame and a shunt plate in the buckle extendable into the first bracket into a relationship located between the sensor integrated circuit and the magnet for blocking the magnetic field generated by the magnet, the first bracket and the battery being coupled to the interior frame of the vehicle seat belt buckle.

10. The buckle of claim 9 further comprising an electrical power connection line in the buckle extending between the battery and the RF integrated circuit on the first bracket.

\* \* \* \* \*